(12) United States Patent
Arnold et al.

(10) Patent No.: US 11,257,811 B2
(45) Date of Patent: Feb. 22, 2022

(54) POWER SEMICONDUCTOR DEVICE WITH AN AUXILIARY GATE STRUCTURE

(71) Applicant: Cambridge Enterprise Limited, Cambridge (GB)

(72) Inventors: Martin Arnold, Cambridge (GB); Loizos Efthymiou, Cambridge (GB); David Bruce Vail, Norfolk (GB); John William Findlay, Cambridge (GB); Giorgia Longobardi, Cambridge (GB); Florin Udrea, Cambridge (GB)

(73) Assignee: Cambridge Enterprise Limited, Cambridge (GB)

( * ) Notice: Subject to any disclaimer, the term of this patent is extended or adjusted under 35 U.S.C. 154(b) by 0 days.

(21) Appl. No.: 16/920,063

(22) Filed: Jul. 2, 2020

(65) Prior Publication Data

US 2020/0335493 A1 Oct. 22, 2020

Related U.S. Application Data

(63) Continuation-in-part of application No. 16/630,321, filed as application No. PCT/GB2018/051999 on Jul.
(Continued)

(30) Foreign Application Priority Data

Jul. 14, 2017 (GB) ..................................... 1711361

(51) Int. Cl.
*H01L 27/06* (2006.01)
*H01L 49/02* (2006.01)
(Continued)

(52) U.S. Cl.
CPC ...... *H01L 27/0605* (2013.01); *H01L 21/8252* (2013.01); *H01L 27/0629* (2013.01);
(Continued)

(58) Field of Classification Search
CPC . H01L 27/0605; H01L 27/0629; H01L 28/20; H01L 29/7786; H01L 29/2003;
(Continued)

(56) References Cited

U.S. PATENT DOCUMENTS 5,939,941 A 8/1999 Nair et al.
8,017,978 B2 9/2011 Lidow et al.
(Continued)

FOREIGN PATENT DOCUMENTS

EP 2390919 A2 11/2011
EP 2597767 A2 5/2013
(Continued)

OTHER PUBLICATIONS

Wael et al., "AlGan HEMT based digital circuits on 3C-SiC(111)/Si(111) pseudosubstrates" Phys. Status Solidi A 214, No. 4, 1600416 (2017), 6 pages.
(Continued)

*Primary Examiner* — Ahmed N Sefer
(74) *Attorney, Agent, or Firm* — Tucker Ellis LLP

(57) ABSTRACT

The disclosure relates to a III-nitride power semiconductor based heterojunction device including a low voltage terminal, a high voltage terminal, a control terminal and an active heterojunction transistor formed on a substrate, and further including the following monolithically integrated components: voltage clamp circuit configured to limit a maximum potential that can be applied to the internal gate terminal, an on-state circuit configured to control the internal gate terminal of the active heterojunction transistor during an on-state operation, a turn-off circuit configured to control the internal gate terminal of the active heterojunction transistor during a turn-off operation and during an off-state.

20 Claims, 19 Drawing Sheets

Related U.S. Application Data 13, 2018, application No. 16/920,063, which is a continuation-in-part of application No. 16/405,619, filed on May 7, 2019, which is a continuation-in-part of application No. PCT/GB2018/051999, filed on Jul. 13, 2018.

(51) Int. Cl.

| | | |
|---|---|---|
| *H01L 29/778* | (2006.01) | |
| *H01L 29/20* | (2006.01) | |
| *H01L 29/205* | (2006.01) | |
| *H01L 29/872* | (2006.01) | |
| *H01L 21/8252* | (2006.01) | |
| *H01L 29/861* | (2006.01) | |
| *H01L 27/088* | (2006.01) | |
| H01L 29/10 | (2006.01) | |

(52) U.S. Cl.
CPC .......... *H01L 27/0883* (2013.01); *H01L 28/20* (2013.01); *H01L 28/40* (2013.01); *H01L 29/2003* (2013.01); *H01L 29/205* (2013.01); *H01L 29/7786* (2013.01); *H01L 29/861* (2013.01); *H01L 29/872* (2013.01); *H01L 29/1066* (2013.01)

(58) Field of Classification Search
CPC ..... H01L 29/205; H01L 29/872; H01L 28/40; H01L 27/0883; H01L 21/8252; H01L 29/861; H01L 29/1066
See application file for complete search history.

(56) References Cited

U.S. PATENT DOCUMENTS

| | | | |
|---|---|---|---|
| 8,470,652 | B1 | 6/2013 | Brown et al. |
| 9,882,553 | B2 | 1/2018 | Kwan et al. |
| 10,170,973 | B1 | 1/2019 | Hirose |
| 10,374,591 | B2 | 8/2019 | Ramabhadran et al. |
| 10,411,681 | B2 | 9/2019 | Kwan et al. |
| 2002/0113274 | A1 | 8/2002 | Iwagami |
| 2007/0247211 | A1 | 10/2007 | Brindle |
| 2009/0065810 | A1 | 3/2009 | Honea |
| 2010/0258843 | A1 | 10/2010 | Lidow |
| 2011/0193171 | A1* | 8/2011 | Yamagiwa .......... H01L 27/0605 257/355 |
| 2011/0210377 | A1 | 9/2011 | Haeberlen |
| 2011/0248283 | A1 | 10/2011 | Cao |
| 2011/0309372 | A1* | 12/2011 | Xin ..................... H01L 27/0605 257/76 |
| 2012/0228625 | A1 | 9/2012 | Ikeda |
| 2012/0292665 | A1 | 11/2012 | Marino et al. |
| 2012/0306545 | A1 | 12/2012 | Machida et al. |
| 2013/0009165 | A1 | 1/2013 | Park et al. |
| 2013/0099247 | A1 | 4/2013 | Palacios et al. |
| 2013/0181215 | A1 | 7/2013 | Adekore |
| 2013/0249622 | A1 | 9/2013 | Honea et al. |
| 2014/0001557 | A1 | 1/2014 | Mishra |
| 2014/0015066 | A1 | 1/2014 | Wu |
| 2014/0048850 | A1 | 2/2014 | Jeon |
| 2014/0049296 | A1 | 2/2014 | Jeon et al. |
| 2014/0061647 | A1 | 3/2014 | Wender |
| 2014/0084966 | A1 | 3/2014 | Takemae |
| 2014/0103969 | A1 | 4/2014 | Jeon |
| 2014/0138701 | A1 | 5/2014 | Huang et al. |
| 2014/0159119 | A1 | 6/2014 | Derluyn |
| 2014/0327043 | A1 | 11/2014 | Kim et al. |
| 2015/0108547 | A1 | 4/2015 | Hwang |
| 2015/0171750 | A1 | 6/2015 | Zeng et al. |
| 2015/0243775 | A1 | 8/2015 | Haeberlen et al. |
| 2015/0357321 | A1* | 12/2015 | Ikeda ..................... H03K 17/12 257/76 |
| 2016/0172284 | A1 | 6/2016 | Cho |
| 2016/0322466 | A1 | 11/2016 | Simin |
| 2016/0373106 | A1 | 12/2016 | Shah et al. |
| 2017/0025405 | A1* | 1/2017 | Jeon .................. H03K 17/6871 |
| 2017/0110448 | A1 | 4/2017 | Prechtl |
| 2017/0133498 | A1 | 5/2017 | Okawa |
| 2017/0148912 | A1 | 5/2017 | Chu |
| 2017/0194477 | A1 | 7/2017 | Lin et al. |
| 2017/0345920 | A1 | 11/2017 | Nagahisa |
| 2018/0145684 | A1 | 5/2018 | Chang et al. |
| 2018/0182878 | A1 | 6/2018 | Morvan |
| 2018/0374943 | A1 | 12/2018 | Liu et al. |
| 2019/0036519 | A1 | 1/2019 | Hu et al. |
| 2019/0312137 | A1 | 10/2019 | Shibib et al. |
| 2020/0007119 | A1 | 1/2020 | Li et al. |
| 2020/0357906 | A1 | 11/2020 | Udrea et al. |
| 2020/0357909 | A1 | 11/2020 | Udrea et al. |
| 2021/0226621 | A1 | 7/2021 | Chuang |

FOREIGN PATENT DOCUMENTS

| | | |
|---|---|---|
| JP | 2010051165 A | 3/2010 |
| KR | 1020160083256 A | 7/2016 |
| WO | 2012055570 A1 | 5/2012 |
| WO | 2019012293 A1 | 1/2019 |

OTHER PUBLICATIONS

O. Ambacher et al., "Two-dimensional electron gases induced by spontaneous and piezoelectric polarization charges n N- and Ga-face AlGaN/GaN heterostructures", Journal of Applied Physics 85, 3222, 1999, http:dx.doi.org/10.1063/1.369664, 13 pages.

Bin Lu et al., "High-Performance Integrated Dual-Gate AlGaN/GaN Enhancement-Mode Transistor", IEEE Electron Device Letters, vol. 31, No. 9, Sep. 2010, pp. 990-992, 3 pages.

L. Efthymiou et al., "On the physical operation and optimization of the p-GaN gate in normally-off GaN HEMT devices", Appl. Phys. Lett. 110, 123502, 2017, 6 pages.

Loizos Efthymiou et al., "On the Source of Oscillatory Behaviour during Switching of Power Enhancement Mode GaN HEMTs", Energies, 2017, 11 pages.

Peijie Feng et al., "Design of Enhancement Mode Single-gate and Doublegate Multi-channel GaN HEMT with Vertical Polarity Inversion Heterostructure", Proceedings of The 25th International Symposium on Power Semiconductor Devices & ICs, Kanazawa, 4 pages.

GaN Systems Inc., "GN001 Application Guide Design with GaN Enhacement mode HEMT", Feb. 28, 2018, 45 pages.

GaN Systems Inc., Bottom-side cooled 650 V E-mode GaN transistor Preliminary Datasheet, 2009-2017, 4 pages.

Injun Hwang et al., "1 6kV, 2.9 mΩ cm2 Normally-off p-GaN HEMT Device", Proceedings of the 2012 24th International Symposium on Power Semiconductor Devices and ICs Jun. 3-7, 2012—Bruges, Belgium, pp. 41-44, 15 pages.

Infineon, "MOSFET Metal Oxide Semiconductor Field Effect Transistor", CoolMOS C7, Apr. 29, 2013, 4 pages.

Man Ho Kwan et al., "CMOS-Compatible GaN-on-Si Field-Effect Transistors for High Voltage Power Applications", pp. 17.6.1-17.6.4, 2014, 3 pages.

Finella Lee et al., "Impact of Gate Metal on the Performance of p-GaN/AlGaN/GaN High Electron Mobility Transistors", pp. 232-234, IEEE Electron Device Letters, vol. 36, No. 3, Mar. 2015, 3 pages.

Silvia Lenci et al., "Au-Free AlGaN/GaN Power Diode on 8-in Si Substrate With Gated Edge Termination", pp. 1035-1037, IEEE Electron Device Letters, vol. 34, No. 8, Aug. 2013.

Umesh K. Mishra et al., "GaN-Based RF Power Devices and Amplifiers", Proceedings of the IEEE, vol. 96, No. 2, Feb. 2008.

Tohru Oka et al., "AlGaN/GaN Recessed MIS-Gate HFET With High-Threshold-Voltage Normally-Off Operation for Power Electronics Applications", IEEE Electron Device Letters, vol. 29, No. 7, Jul. 2008.

Hideyuki Okita et al., "Through Recessed and Regrowth Gate Technology for Realizing Process Stability of GaN-GITs", Proceed-

(56) References Cited

OTHER PUBLICATIONS ings of the 2016 28th International Symposium on Power Semiconductor Devices and ICs (ISPSD), Jun. 12-16, 2016, Prague, Czech Republic.

Yasuhiro Uemoto et al., "Gate Injection Transistor (GIT)—A Normally-Off AlGaN/GaN Power Transistor Using Conductivity Modulation", IEEE Transactions on Electron Devices, vol. 54, No. 12, Dec. 2007.

Michael J. Uren et al., "Buffer Design to Minimize Current Collapse in GaN/AlGaN HFETs", IEEE Transactions on Electron Devices, vol. 59, No. 12, Dec. 2012.

Wataru Saito et al., "Recessed-Gate Structure Approach Toward Normally Off High-Voltage AlGaN/GaN HEMT for Power Electronics Applications", IEEE Transactions on Electron Devices, vol. 53, No. 2, Feb. 2006.

Yong Cai et al., "High-Performance Enhancement-Mode AlGaN/GaN HEMTs Using Fluoride-Based Plasma Treatment", IEEE Electron Device Letters, vol. 26, No. 7, Jul. 2005.

Tsai Jung-Ruey et al., "Engineered threshold voltage in AlGaN/GaN HEMTs for normally-off operation", 2015 International Symposiun on Next-Generation Electronics (ISNE), IEEE, May 4, 2015, pp. 1-2, XP032789065, DOI: 10.1109/ISNE.2015.7131989 section "Methodology"; figure 4, 2 pages.

Yu, Guohao, et al., "Dynamic Characterizations of AlGaN/GaN HEMTs with Field Plates Using a Double-Gate Structure", IEEE, vol. 34, No. 2, Feb. 2013, p. 217-219, 3 pages.

International Search Report and Written Opinion from correlating International Application No. PCT/GB2018/051999, dated Nov. 27, 2018, 19 pages.

International Search Report and Written Opinion from Corresponding International Application No. PCT/EP2020/062710, dated Aug. 24, 2020, 22 pages.

\* cited by examiner

POWER SEMICONDUCTOR DEVICE WITH AN AUXILIARY GATE STRUCTURE

RELATED APPLICATION DATA

This application is a continuation-in-part of U.S. patent application Ser. No. 16/630,321, filed Jan. 10, 2020, which is a U.S. National Phase Entry of PCT/GB2018/051999, filed Jul. 13, 2018, which claims the benefit of United Kingdom Patent Application No. 1711361.4, filed Jul. 14, 2017, the disclosures of which are incorporated herein by reference in their entireties. This application also is a continuation in part of U.S. patent application Ser. No. 16/405,619, filed May 7, 2019, which is a continuation in part of International Patent Application No. PCT/GB2018/051999, filed Jul. 13, 2018, which claims the benefit of United Kingdom Patent Application No. 1711361.4, filed Jul. 14, 2017, the disclosures of which are incorporated herein by reference in their entireties.

TECHNICAL FIELD

The present disclosure relates to a power semiconductor device, for example to a hetero-structure aluminium gallium nitride/gallium nitride (AlGaN/GaN) high electron mobility transistor (HEMT) or rectifier.

BACKGROUND

A power semiconductor device is a semiconductor device used as a switch or rectifier in power electronics (e.g., dc to ac inverter for motor control or dc to dc converter for switched-mode power supplies). A power semiconductor device is usually used in "commutation mode" (i.e., it is either on or off), and therefore has a design optimized for such usage.

In general, a power device has a rated voltage (i.e. the potential difference that the device has to withstand in the off-state between its main terminals) of over 20 V and conducts more than 100 mA during on-state. More commonly the rating of a power device is above 60V and above 1 A. These values make the power devices very different from the low power devices, which operate with voltages below 5V and typical currents of under 1 mA and more commonly in the range of μAs or sub μAs. Another differentiation between power devices and other types of devices such as low power or RF, is that they operate mainly with large signals and they behave like switches. An exception to that is found in high voltage or power amplifiers, which use specialised power transistors.

Silicon bipolar junction transistors (BJT), metal-oxide-semiconductor field effect transistors (MOSFET) and insulated gate bipolar transistors (IGBT) are common types of power semiconductor switching devices. Their application areas range from portable consumer electronics, domestic appliances, hybrid and electric cars, motor control and power supplies to RF and microwave circuits and telecommunication systems.

Gallium Nitride (GaN) has increasingly been considered as a very promising material for use in the field of power devices with the potential to lead to increased power density, reduced on-resistance, and high frequency response. The wide band gap of the material ($E_g$=3.39 eV) results in high critical electric field ($E_c$=3.3 MV/cm) which can lead to the design of devices with a shorter drift region, and therefore lower on-state resistance, if compared to a silicon-based device with the same breakdown voltage [1]. The use of an AlGaN/GaN heterostructure also allows the formation of a two-dimensional electron gas (2DEG) at the hetero-interface where carriers can reach very high mobility ($\mu$=2000 cm$^2$/(Vs)) values [1]. In addition, the piezopolarization charge present at the AlGaN/GaN heterostructure, results in a high electron density in the 2DEG layer (e.g. 1×10$^{13}$ cm$^{-2}$). These properties allow the development of High Electron Mobility Transistors (HEMTs) and Schottky barrier diodes with very competitive performance parameters [2], [3]. An extensive amount of research has focused on the development of power devices using AlGaN/GaN heterostructures.

However, the 2DEG which inherently exists at the AlGaN/GaN hetero-interface creates a challenge when attempting the design of normally-off rather than normally-on devices. Nonetheless, as normally-off transistors are preferable in most power electronic applications several methods have been proposed which can lead to enhancement mode devices, among them the use of metal insulator semiconductor structures [4], use of fluorine treatment [5], recessed gate structures [6] and use of a p-type cap layer [7][8]. Due to the relative maturity and controllability in the epitaxial growth of pGaN layers compared to the other techniques, pGaN/AlGaN/GaN HEMTs are considered the leading structure for commercialization.

FIG. 1 shows schematically the cross section in the active area of a state of the art pGaN HEMT. The device shown is a lateral three-terminal device with an AlGaN/GaN heterostructure grown epitaxially on a standard silicon wafer 4. A transition layer 3 is used to allow a high quality GaN layer 2 to be grown despite the significant lattice mismatch between GaN and Si. Carbon p-type doping is often added in the GaN layer [9]. Finally, a thin cap GaN layer 11 is typically added to form the gate with a Magnesium (Mg) p-type doping density greater than 1×10$^{19}$ cm$^{-3}$.

A typical pGaN gate device has a threshold voltage of ~1.5-2V and gate opening bias voltage of ~8V. Threshold voltage and gate opening voltage in enhancement mode GaN devices are of great interest as problems such as unwanted device turn-on when the device is supposed to be off may occur in operation if threshold voltage is low. Secondly, gate turn-on may be a problem due to the non-insulated gate structure. It is therefore apparent that the pGaN gate device operates with a gate voltage in the range of 2V to 8V and preferably between 5 to 7V, to minimise the on-state resistance of the device while ensuring a low leakage through the gate (below the opening voltage).

In the state of the art device a trade-off exists between the threshold voltage of the device and the carrier density in the 2DEG of the device and consequently the device on-state resistance. A previous study has shown that for a pGaN doping greater than 1×10$^{19}$ cm$^{-3}$ the threshold voltage cannot be significantly altered by the use of a different gate metal or the thickness of the pGaN layer [10]. A narrow window of operation is therefore specified in these devices (with gate voltages in the range of 4V to 7V with respect to the source) [11] unlike their silicon counterparts [12]. The lower boundary is defined by the gate bias needed to fully form the channel (2DEG) below the gate (this is referred to as the threshold voltage, Vth), and the upper boundary is limited by the point at which the gate turns on and considerable current starts flowing through it.

Another area of interest in AlGaN/GaN HEMTs is their fast switching capability. The high mobility of carriers in the 2DEG and a shorter drift region for a given breakdown due to higher critical electric field can lead to very low drift region charge, Qgd. Furthermore, the device gate charge Qg is about an order of magnitude lower than corresponding state of the art silicon devices [11], [12]. Therefore, the GaN HEMTs can switch at much higher speeds than silicon MOSFETs. While this is beneficial in many applications, it can lead to unwanted oscillations due to parasitic components present both at the device and circuit level [13]. A possible solution proposed in order to avoid the oscillatory behaviour is to add an external gate resistance to the device in order to reduce the dV/dt and dI/dt rate observed [13].

In [14], an attempt to enlarge the window of operation defined by the threshold voltage and the opening of the pGaN/AlGaN junction has been made by varying the composition of the gate metal. This attempt resulted to be unsuccessful as discussed in [10] where it is showed that for a pGaN doping greater than $1 \times 10^{19}$ cm$^{-3}$ the threshold voltage cannot be significantly altered using a different gate metal or by altering the thickness of the pGaN layer.

In [16] a higher Vth on a P-gate technology has been obtained via 'Through Recessed and Regrowth Gate (TRRG)' technique. This process technology is based on a complete removal of the AlGaN barrier layer and subsequent regrowth of it by epitaxial regrowth. This demonstrates more stable threshold voltages at increasing temperatures and the possibility to reach Vth as high as 2.3V by controlling the thickness of the AlGaN layer. Although this is an interesting process technology to obtain a stable threshold voltage, it does affect the Ron when a Vth>2V is achieved. Moreover, the high Vth solution presented in [16] does not address the problem of the Rg-related oscillations during the fast switching of the high voltage transistor, nor the high gate leakage of the pGaN gate technology.

In [17] an integrated double-gate technology for achieving high Vth (>2.8V) is demonstrated. The double-gate technology suggested in [17] is based on the integration of a high voltage normally-on (D-Mode) and low voltage normally-off (E-Mode) GaN transistors. In this configuration however, the two transistors are in series and the overall on-state resistance will be therefore be affected by the series contribution of the on-state resistance of the low voltage device.

Other proposed double-gate technologies are present in literature and they are so called as they feature a second gate electrode either on top of the gate passivation layer [18] or buried into the heterostructures stack [19]. These devices mainly aim at improving the dynamic performance of the transistors by alleviating the current collapse phenomenon. The current collapse phenomenon is in fact a current reduction in the on-state, when the device is repeatedly stressed to high voltages in the off-state.

An attempt to increase the Vth of a normally-off (enhancement mode—E-Mode) GaN transistor using a circuit configuration with diodes and a second gate electrode is made in [20]. In this document the diodes are used as voltage shifters and are connected in series with the gate of the high-voltage GaN devices. A device where the voltage shifter is achieved with a transistor is also described. In this particular case, however, the drain terminal of the voltage-shifter-transistor is connected with the high-voltage drain terminal of the GaN device. The implication of such connection is that the driving device will have to sustain the high voltage in blocking mode and therefore be designed as a high voltage transistor with a longer drift region than for a low-voltage device. The device will therefore have increased area consumption and reliability of this additional transistor has to be taken into account. In addition in [20] no mention is made of the upper boundary limitation.

Resistive loads connected between the gate and source of GaN HEMTs or Power MOSFETs in general are also known and their aim can vary from reducing the oscillations during high voltage switching, protecting the device against electro-static discharge and in general ensuring a robust operation. For example in the data sheet of the GaN Systems parts [21] a 3 kΩ resistor is recommended to be added between the gate terminal (gate bus) and the source (or ground).

SUMMARY

It is the aim of this invention to propose a solution for a p-gate GaN E-Mode transistor for concomitantly (i) leads to a reduction in the gate leakage current (ii) an increase in the threshold voltage, and (iii) an increase in the gate voltage operation window. The result of these three features are (i) avoidance of turn-on retriggering during the turn-off and limitations of oscillations in certain turn-off conditions where high dV/dt rates are present (ii) improves the switching performance of the overall configuration via an integrated pull-down network.

According to this invention we propose a GaN power device that has the ability of a high threshold voltage, a significantly large gate voltage operation range with less or no risk of p-GaN junction opening, and oscillation-free or oscillation-reduced switching behaviour. The details of this invention will be discussed considering but not limited to a pGaN gate E-Mode technology.

GaN transistors that utilise this disclosure are intended but not limited to applications in low to medium voltage range. The lower voltage capability devices (<200V but higher than 20V) would be suitable for point-of-load applications i.e. low voltage DC-DC converters for IT or consumer electronics applications. Such devices can also be used in linear electronics to increase efficiency, a large market potential however exists at the 600V range for applications such as power factor correction (PFC), un-interrupted power supplies (UPS), motor drives, and photovoltaic (PV) system inverters. 600V GaN devices can also find use as chargers in hybrid electric vehicles (HEV) and/or electric vehicles (EV), a market which is growing at an enormous pace. GaN transistors with breakdown capabilities up to 1.2 kV and power ratings which can reach 7.2 kW can lead to GaN transistors being used in EV and HEV converters and inverters where the high frequency of operation will allow a reduction in system size, a parameter which is significant when considering mobile systems. Ultimately, if the power rating is extended enough GaN transistors could find application in wind turbines (1.7 kV). Recent applications which require reliable operation in the MHz regime such as wireless charging in both IT (mobile phones, laptop) and automotive (EV, HEV) sectors may be very suitable for this disclosure. Additionally, applications beyond power conversion are also envisioned such as class D audio amplifiers.

Broadly speaking, the disclosure relates to power semiconductor devices using GaN technology. The disclosure proposes an integrated auxiliary gate terminal and a pull-down network to achieve a normally-off (E-Mode) GaN transistor with threshold voltage higher than 2V, low gate leakage current and possibly enhanced switching performance. The high threshold voltage GaN transistor has a high-voltage active GaN device and an auxiliary GaN device, which could be preferably a low-voltage device, wherein the high-voltage GaN device has the gate connected to the source of the integrated auxiliary GaN transistor and the drain being the external high-voltage drain terminal and the source being the external source terminal, while the auxiliary GaN transistor has the gate (first auxiliary electrode) connected to the drain (second auxiliary electrode)

functioning as an external gate terminal. In other embodiments a pull-down network for the switching-off of the high threshold voltage GaN transistor is formed by a diode, a resistor, or a parallel connection of both connected in parallel with the auxiliary GaN transistor.

In other embodiments a pull down network for the switching off of the active (high voltage) GaN transistor is formed by additional auxiliary low-voltage GaN transistors and resistive elements connected in parallel or in series with the low-voltage auxiliary GaN transistor.

In other embodiments, a pull down network for the switching off of the active (high voltage) GaN transistor is formed by an active Miller clamp.

In other embodiments, an overvoltage protection circuit is formed by resistors or resistive elements and a low voltage enhancement mode (or depletion mode) transistor to limit the maximum potential at the gate of the active (high voltage) transistor.

In other embodiments, an over-current protection circuit is formed by a current sensing resistor or resistive element and a low voltage enhancement mode (or an active depletion mode) transistor to act as protection from over-current events.

In other embodiments, some or all of the functional blocks described can be used together to add enhanced functionality.

Since the auxiliary GaN Transistor would preferably be a low voltage device, its source and drain terminal could be interchanged as they are commonly made in a symmetrical (or similar) way. By a low-voltage device, we mean a device that can typically have a rated breakdown below 20V and limited current capability (under 100 mA). However, it should be understood that the auxiliary gate could also be a high power or high voltage device, although this may add cost and complexity.

Most of the embodiments according to this disclosure described here are concerned with an integrated auxiliary transistor, whereby the auxiliary transistor and the active transistor are made on the same substrate (in the same chip). While the integration of the two could be advantageous for several reasons, such as fewer pads, low area consumption, compact size, lower cost and lower complexity, the auxiliary transistor could also be made on a separate substrate and connected to the active transistor in a discrete or hybrid way. The auxiliary and the active transistors could be placed side by side in the same package or module or discretely connected on a board and not necessarily integrated within the same GaN chip.

According to one aspect of the present disclosure, there is provided a III-nitride semiconductor based heterojunction power device, comprising:
  an active heterojunction transistor formed on a substrate, the active heterojunction transistor comprising:
    a first III-nitride semiconductor region comprising a first heterojunction comprising an active two dimensional carrier gas of second conductivity type;
    a first terminal operatively connected to the III-nitride semiconductor region;
    a second terminal laterally spaced from the first terminal and operatively connected to the III-nitride semiconductor region;
    an active gate region formed over the III-nitride semiconductor region, the active gate region being formed between the first terminal and the second terminal;
  an auxiliary heterojunction transistor formed on the said substrate or a further substrate, the auxiliary heterojunction transistor comprising:
    a second III-nitride semiconductor region comprising a second heterojunction comprising an auxiliary two dimensional carrier gas of second conductivity type;
    a first additional terminal operatively connected to the second III-nitride semiconductor region;
    a second additional terminal laterally spaced from the first additional terminal and operatively connected to the second III-nitride semiconductor region;
    an auxiliary gate region formed over the second III-nitride semiconductor region, the auxiliary gate region being formed between the first additional terminal and the second additional terminal;
  wherein the first additional terminal is operatively connected with the auxiliary gate region, and wherein the second additional terminal is operatively connected with the active gate region,
  wherein the auxiliary heterojunction transistor is a first auxiliary heterojunction transistor, and wherein the heterojunction power device further comprises a second auxiliary heterojunction transistor which is operatively connected in parallel with the first auxiliary transistor, and wherein the first additional terminal of the first auxiliary heterojunction transistor is operatively connected to a source terminal of the second auxiliary heterojunction transistor, and the second additional terminal of the first auxiliary heterojunction transistor is operatively connected to a drain terminal of the second auxiliary heterojunction transistor,
  wherein the auxiliary heterojunction transistor is configured to (or the addition of the auxiliary heterojunction transistor) result in an increase in a threshold voltage of said heterojunction power device and/or an increase in an operation voltage range of the first additional terminal.

Here the term "operatively connected" means the terminals are electrically connected. In other words, the first additional terminal and the auxiliary gate are electrically connected, and the second additional terminal and the active gate region are electrically connected. Furthermore, in one embodiment, the first terminal is a source terminal of the active transistor, and the second terminal is a drain terminal of the active transistor. On the other hand, the first additional terminal is a drain terminal of the auxiliary transistor and the second additional terminal is a source terminal of the auxiliary transistor. In embodiments, the connected first additional terminal and the auxiliary gate region form a high voltage terminal (or form an external gate terminal) in which a relatively higher voltage is applied compared to the second additional terminal. Therefore, the second additional terminal can be termed as a low voltage terminal of the auxiliary transistor. Here the term "III-nitride semiconductor region" generally refers to an entire region comprising a GaN layer and an AlGaN layer formed on the GaN layer. The two dimensional carrier gas is generally formed at the interface between the GaN layer and the AlGaN layer within the III-nitride semiconductor region. In embodiments, the two dimensional carrier gas refers to two dimensional electron gas (2DEG) or two dimensional hole gas (2DHG).

When integrated on the same substrate (monolithical integration), the heterojunction power device may further comprise an isolator region between the active heterojunction transistor and the auxiliary heterojunction transistor. The isolator region separates the active two dimensional carrier gas and the auxiliary two dimensional carrier gas. Isolator region may separate the first and second III-nitride semiconductor regions.

In use, when the first additional terminal and the auxiliary gate region may be biased at a potential (or a voltage), a carrier density in a portion of the auxiliary two dimensional carrier gas underneath the auxiliary gate region is controlled such that an auxiliary two dimensional carrier gas connection is established between the first and second additional terminals. Generally, there is a two dimensional electron gas (2DEG) formed underneath the first and second additional terminals. When a voltage is applied to the auxiliary gate region (or the high voltage terminal), it controls the carrier density in the 2DEG underneath the auxiliary gate so that a 2DEG connection is formed between the 2DEG underneath the first and second additional terminals.

The active gate region may be configured to be switched on through the auxiliary two dimensional carrier gas (e.g. 2DEG) connection between the first and second additional terminals. The resistance variation from the 2DEG connection underneath the auxiliary gate region enables to turn on the active gate as well. The auxiliary 2DEG connection may serve as an internal resistance to the active gate region. Such an internal gate resistance could be useful to slow down the fast dV/dt during switching or prevent high oscillations caused by di/dt effects.

The first additional terminal and the auxiliary gate region may be configured such that a part of the potential is used to form the auxiliary 2DEG connection and a further part of potential is used to switch on the active gate region.

The first III-nitride semiconductor region may comprise an active aluminium gallium nitride (AlGaN) layer directly in contact with the first terminal, the active gate region and the second terminal.

The second III-nitride semiconductor region may comprise an auxiliary aluminium gallium nitride (AlGaN) layer directly in contact with the first additional terminal, the auxiliary gate region and the second additional terminal.

The thickness of the active AlGaN layer and the auxiliary AlGaN layer may be the same or different.

The doping concentration of the active AlGaN layer and the auxiliary AlGaN layer may be the same or different.

The aluminium mole fraction of the active AlGaN layer and the auxiliary AlGaN layer may be the same or different.

The active gate region may comprise a p-type gallium nitride (pGaN) material. The metal contact on the active pGaN gate could be Schottky or ohmic. Alternatively, the active gate region may comprise a recessed Schottky contact.

The first terminal, the second terminal, the first additional terminal and the second additional terminal may each comprise a surface ohmic contact. Alternatively, the first terminal, the second terminal, the first additional terminal and the second additional terminal may each comprise a recessed ohmic contact.

The auxiliary gate region may comprise a field plate extending towards the first additional terminal and wherein the field plate extends over a field oxide region.

The power device may have an interdigitated layout in which a gate metal pad is directly connected with the auxiliary gate region and the first additional terminal, and the active gate region comprises gate fingers connected with the second additional terminal. Alternatively, the device may have an interdigitated layout in which the auxiliary gate region, the first additional terminal and the second additional terminal are placed below a source metal pad. Advantageously, no additional wafer area would be needed to include the auxiliary gate structure compared to a state of the art design.

In embodiments, the second additional terminal and the active gate region may be connected in a third dimension of the device.

The active heterojunction transistor may be a high voltage transistor and the auxiliary heterojunction transistor may be a low voltage transistor compared to the active heterojunction transistor.

The heterojunction power device may further comprise a diode connected in parallel between the first and second additional terminals of the auxiliary heterojunction transistor. The parallel diode acts as a pull-down network during the turn-off of the overall configuration connecting to ground from the gate terminal of the active GaN transistor. When a positive bias (on-state) is applied to the auxiliary gate, the diode will be reverse-biased and zero current will flow through it, leaving unaffected the electrical behaviour of the overall high-voltage configuration. When a zero bias (off-state) will be applied to the auxiliary gate the diode will forward bias and the turn-off current flowing through it will discharge the gate capacitance of the active transistor, thus enabling the switching off of the overall configuration. In off-state, the gate of the active transistor will remain biased to a minimum voltage equal to the turn-on voltage of the diode. The diode will therefore be designed in such a way that its turn-on voltage will be as low as possible, ideally few mV. The diode may be formed monolithically with the device. The diode could be a simple Schottky diode. The diode generally pulls down the active gate during turn-off to the diode Vth, therefore the diode needs to be designed to have as low a threshold voltage as possible. A feature which can achieve this is the use of a recessed anode such that the contact is made directly to the 2DEG.

Alternatively, a normally-on (depletion mode) GaN power device not in prior art may be utilized. This normally-on device may contain a gate structure based on discontinuous p-GaN layer (or discontinuous regions of first conductivity type) containing islands within stripes or closed shapes around the cells that act to modulate the conductive path, given by the 2D electron gas (or the 2D carrier gas of the second conductivity type) between the high voltage terminal and low voltage terminal, when a gate voltage is provided. All such islands may be connected to the same gate electrode. It will be appreciated that by discontinuous islands we mean that between adjacent islands there is no p-GaN layer present, and as such, there is a direct, unobstructed conductive path between the source and the drain terminals, provided by the 2D electron gas. However, adjacent islands are placed closed together across (orthogonal to) the current path such that the potential applied to the p-GaN gate islands modulate the conductive region between the islands and thus modulate the direct path between the source and the drain. The p-GaN layers in the continuous and discontinuous gate structures are done in the same process step and the difference between continuous and discontinuous is realized by a layout change of the same mask.

The operation of this normally on (depletion mode) device may be characterised by the existence of two threshold voltages. The first threshold voltage may be negative and is equivalent to that of a classical normally-on transistor, indicating the transition from the off to on-state. The second threshold voltage is preferably positive and is characterised by a steep current increase. The second threshold voltage can occur at the same value as that of an integrated normally-off device featuring a continuous p-GaN gate.

Two threshold voltages are clearly discussed and identified below in greater detail.

The first threshold voltage referred to here as the device threshold voltage may be adjusted through layout modifications in addition to epitaxy/process modifications. Furthermore, the depletion mode (normally on) device proposed here may allow for an increased positive gate bias voltage to be applied (>7V) before the main on-state conduction channel changes from drain-source to gate-source. Such a device can be implemented in a fabrication process which does not offer a Schottky contact on the surface of the AlGaN layer.

Alternatively, the normally on depletion device using discontinuous pGaN islands could be used in a diode mode, by connecting the gate and source together, which becomes the anode terminal (or because of the symmetry by connecting the drain and gate together). The distance (pitch) between the pGaN islands could be used to adjust the voltage level at which the diode conducts current in the forward mode. This is particularly advantageous over the prior art where a continuous pGaN layer is used which could result in a large forward voltage. For example, the pitch between pGaN islands (or multiple stripes of pGaN islands) could be used to adjust this opening forward voltage to be 0.3 to 0.5V, which is specific to Schottky diodes in silicon. To avoid a negative opening voltage, which is undesirable for a diode, the pitch between the pGaN islands should be very small (orders of tens or hundreds of nanometres), or the source of the HEMT connected in the diode configuration can feature a Schottky contact.

A second increase in the current is present at a higher voltage level (higher than the opening voltage level) during forward conduction, when the 2DEG under the pGaN layer is formed. It is desirable that in forward conduction, the diode operates beyond this second voltage level to minimise the on-state resistance.

In all embodiments, the contact to the pGaN islands could be made of ohmic or Schottky metallisation.

The first additional terminal (or the drain (gate) terminal) and the second additional terminal (or the source terminal) of the (first) auxiliary heterojunction transistor may each act as external gate terminals.

In the present disclosure, the auxiliary heterojunction transistor is a first auxiliary heterojunction transistor, and the heterojunction device further comprises a second auxiliary heterojunction transistor which is operatively connected in parallel with the first auxiliary transistor, and the first additional terminal (or the drain (gate) terminal) of the first auxiliary heterojunction transistor may be connected to a source terminal of the second auxiliary heterojunction transistor, and the second additional terminal (or the source terminal) of the first auxiliary heterojunction transistor may be operatively connected to a drain (gate) terminal of the second auxiliary heterojunction transistor.

The pull-down network through the second auxiliary heterojunction transistor may further comprise of a resistor added in series with the second auxiliary transistor between the gate and drain terminal of the second auxiliary transistor. The resistor is between the gate and drain terminals of the second auxiliary transistor. Therefore the resistor does not form a common junction between the first auxiliary transistor and the gate of the active transistor. The resistor acts to reduce the active gate capacitance discharge time through the pull-down network during the turn-off of the heterojunction power device. The additional resistive element performs this function by leading to an increased potential, during turn-off, of the second auxiliary transistor gate terminal compared to the second auxiliary transistor drain terminal.

An additional resistor could be connected between the drain terminal of the second auxiliary transistor and the source terminal of the active power transistor. The additional resistor acts as a parallel pull-down network during the active device turn-off. Therefore, it will be understood that the additional resistor is not connected through a common junction connecting the source of the first auxiliary transistor and the gate of the active transistor. During the active device turn-on and on-state the additional resistor can act as a voltage limiting component to protect the gate terminal of the active device.

The pull-down network through the second auxiliary heterojunction transistor may further comprise of a third auxiliary transistor added in series with the second auxiliary transistor between the gate and drain terminal of the second auxiliary transistor. The third auxiliary transistor acts to reduce the active gate capacitance discharge time through the pull-down network during the turn-off of the heterojunction power device. The third auxiliary transistor performs this function by leading to an increased potential, during turn-off, of the second auxiliary transistor gate terminal compared to the second auxiliary transistor drain terminal. The third auxiliary transistor may be a depletion mode low-voltage transistor. The depletion mode device could be made using p-GaN islands as shown in FIG. 44, or could be a diode as shown in FIG. 45. The gate terminal of the third auxiliary transistor may be connected to either the source or drain terminal of the third auxiliary transistor. An additional resistor could be connected between the drain terminal of the second auxiliary transistor and the source terminal of the active (high voltage) transistor. In other words, it will be understood that the additional resistor is not connected through a common junction connecting the source of the first auxiliary transistor and the gate of the active transistor. The additional resistor acts as a parallel pull-down network during the active device turn-off. During the active device turn-on and on-state the additional resistor can act as a voltage limiting component to protect the gate terminal of the active device.

The heterojunction power device may further comprise a voltage limiting circuit composed of two resistors forming a potential divider and an actively switched low voltage enhancement mode transistor. The drain source path of the actively switched low voltage enhancement mode transistor is connected between the gate and source of the active power transistor. The potential divider is connected between the first additional terminal (or the drain (gate) terminal) of the first auxiliary heterojunction transistor and the source terminal of the active (high voltage) transistor. The mid-point of the potential divider is connected to the gate terminal of the low voltage enhancement mode transistor. The enhancement mode transistor can turn-on, and thus adjust the resistance between the active device gate terminal and the active (high voltage) device source terminal, when the voltage of the first additional terminal (or the drain (gate) terminal) of the first auxiliary heterojunction transistor is raised above a certain value which can be controlled by the choice of resistors in the potential divider described. This function can protect the active gate terminal from over-voltage events.

The heterojunction power device may further comprise a voltage limiting circuit as described above where the low voltage enhancement mode transistor is replaced with a low voltage depletion mode transistor. In this embodiment, the resistance of the depletion mode transistor can be reduced, and thus adjust the resistance between the active (high voltage) device gate terminal and the active device source terminal, when the potential of the first additional terminal (or the drain (gate) terminal) of the first auxiliary heterojunction transistor is increased. The potential divider formed by the resistors determines the potential on the gate terminal of the depletion mode transistor. The circuit described can protect the active gate terminal from over-voltage events.

The heterojunction power device may further comprise an over-current protection circuit composed of a current sensing resistor and an actively switched low voltage enhancement mode transistor. The active area of the active (high voltage) transistor is divided into two regions forming two transistors in parallel. The drain and gate terminals of the two transistors are electrically connected. The two transistors in parallel are a low resistance (main power) transistor and a high resistance (current sensing) transistor comparatively. The first terminal of the current sensing resistor is connected to the source terminal of the high resistance transistor. The actively switched enhancement mode transistor is connected between the gate terminal of the active (high voltage) transistors and the second terminal of the current sensing resistor. The gate terminal of the low voltage enhancement mode transistor is connected to the first terminal of the current sensing resistor. As current through the high resistance transistor increases, the potential drop across the current sensing resistor increases, raising the potential on the gate of the low voltage enhancement mode resistor and thus adjusting its resistance. A critical current through the low voltage transistor can turn on the low voltage enhancement mode transistor limiting the potential on the gate of the active power transistors. The circuit described can protect the circuit from over-current events. The components described can be included in the design monolithically.

The heterojunction power device may further comprise an over-current protection circuit as described above where the low voltage enhancement mode transistor is replaced with a low voltage depletion mode transistor. Similarly, the potential at the gate terminal of the depletion mode transistor is increased as the current through the current sensing resistor is increased. As the current through the current sensing resistor increases the resistance of the depletion mode transistor can decrease providing a reduction in the resistance of the path between the gate and source of the active (high voltage) devices thus limiting the potential on the active gate terminal. The circuit described can protect the circuit from an over-current event.

The heterojunction power device may further comprise an active Miller clamp to offer an additional pull-down network for the active (high voltage) device gate terminal during the device turn-off transient. The active Miller clamp consists of a logic inverter and an actively switched transistor which acts as the pull down network. The logic inverter could be composed of a resistor or resistive element (i.e. load transistor) and an enhancement mode transistor.

The actively switched transistor could be an enhancement mode or depletion mode transistor. In operation the active Miller clamp uses the voltage bias of the external gate terminal (i.e. the terminal connected to the gate driver) to adjust the resistance of the actively switched transistor such that a low resistance pull-down path is provided when the main power device is turning-off or is in the off-state. When the gate driver signal is high, the bias on the gate of the actively switched transistor in the Miller clamp is low (therefore its resistance is high) and vice versa.

The resistor (in any of the embodiments shown here) could be made of a metal layer in the process, the AlGaN layer or preferably of the 2DEG. The resistor could be shaped in a meander for high packing density. The functional blocks described above may be included in the design discreetly, monolithically or in a hybrid package.

The depletion mode transistor in the functioning blocks described may be a Schottky gate HEMT described in prior art.

Additionally, the normally on (depletion mode) transistor in the functioning blocks described may be the pGaN islands transistor described above.

It will be appreciated that, as already mentioned, the auxiliary heterojunction transistor may have the source and drain interchanged. Unlike in the active (high voltage) transistor, the source and drain in the auxiliary heterojunction may be symmetrical or made and arranged in a similar way, so that the source can take the role of the drain and vice-versa.

According to a second aspect of this invention, there is provided a III-nitride power semiconductor based heterojunction device (also termed in this disclosure as the GaN chip or GaN Power integrated circuit) comprising a low voltage terminal, a high voltage terminal and a control terminal and further comprising the following monolithically integrated components and circuits:

an active heterojunction transistor (also termed the high voltage HEMT or the main HEMT) formed on a substrate, the active heterojunction transistor comprising:
a first III-nitride semiconductor region comprising a first heterojunction comprising an active two dimensional carrier gas;
a first terminal operatively connected to the III-nitride semiconductor region and further connected to the low voltage terminal;
a second terminal laterally spaced from the first terminal and operatively connected to the III-nitride semiconductor region and further connected to the high voltage terminal;
an internal gate terminal operatively connected to an active gate region formed over the III-nitride semiconductor region, the active gate region being formed between the first terminal and the second terminal;
a voltage clamp circuit, wherein the voltage clamp circuit limits the maximum potential that can be applied to the internal gate terminal;
a turn-on circuit, wherein the turn-on circuit primarily controls the internal gate terminal of the active heterojunction transistor during turn-on and wherein the turn-on circuit is configured to control the transient gate current in the internal gate terminal and the transient current in the voltage clamp circuit during turn-on operation;
an on-state circuit, wherein the on-state circuit primarily controls the internal gate of the active heterojunction transistor during on-state operation and wherein the on-state circuit is configured to control the steady-state gate current in the internal gate terminal and the steady-state current in the voltage clamp circuit during on-state operation;
a turn-off circuit wherein the turn-off circuit primarily controls the internal gate of the active heterojunction transistor during turn-off and off-state and wherein the turn-off circuit is configured to control the transient gate current from the internal gate terminal to the control terminal and connect with minimal resistance the internal gate terminal and the control terminal during turn-off and off-state operation, and wherein:

the voltage clamp circuit has, at least, one connection to the internal gate of the said active heterojunction transistor and a second connection to the low voltage terminal;

turn-on circuit has, at least, one connection to the internal gate of the active heterojunction transistor;

the on-state circuit has, at least, one connection to the internal gate of the active heterojunction transistor, and a second connection to the control terminal;

the turn-off circuit has, at least, one connection to the internal gate of active heterojunction transistor, and a second connection to the control terminal;

The voltage clamp circuit described is intended to limit the internal gate to a pre-designed voltage level such that the voltage on the internal gate terminal does not exceed a given level, which is safe for the operation of the active heterojunction transistor.

The maximum voltage signal that can be applied to the external gate of the device (the control terminal of the GaN chip) can be designed to be above about 10V (e.g. about 15V) such that conventional Silicon gate drivers and controllers can be used to drive the heterojunction device (GaN chip).

In some embodiments the voltage clamp circuit (block) can be or comprise one or several pull-down transistors (low voltage high electron mobility transistors—HEMTs) in parallel or in series. The gate potentials of said pull-down HEMTs are controlled to set the voltage drop across the pull-down HEMT and therefore setting the internal gate voltage of the active heterojunction transistor (high voltage HEMT).

In one embodiment the voltage clamp circuit may comprise two resistors forming a potential divider and a low voltage enhancement mode transistor. The drain source path of the low voltage enhancement mode transistor is connected between the internal gate and source of the active heterojunction transistor. The potential divider is connected between the internal gate terminal and the source terminal of the active heterojunction transistor. The mid-point of the potential divider is connected to the gate terminal of the low voltage enhancement mode transistor. The enhancement mode transistor can turn-on, and thus adjust the resistance between the high voltage device internal gate terminal and source terminal, when the voltage of the internal gate terminal is raised above a certain value which can be controlled by the choice of resistors in the potential divider described. This function can clamp the maximum allowable voltage present on the internal gate of the active heterojunction transistor.

The voltage clamp circuit (block) may further comprise elements to compensate or reduce the effect of temperature on the voltage drop across the voltage clamp circuit block.

The integrated on-state circuit (on-state block) may be a resistive element or incorporate a resistive element. Alternatively, the on-state circuit may be or comprise a current source. The current source may be composed of a low-voltage depletion mode HEMT and a resistive element. The resistive element can be connected between the gate and source terminal of the low-voltage depletion mode HEMT. The drain terminal of the depletion mode HEMT may be connected to the control terminal of the GaN chip and the gate terminal of the depletion mode HEMT is connected to the internal gate terminal of the active heterojunction transistor (high voltage HEMT).

The integrated turn-on circuit (turn-on block) may be a resistive element or incorporate a resistive element. Alternatively, the on-state circuit may be or comprise a current source. The current source may be composed of a low-voltage depletion mode HEMT and a resistive element. The resistive element can be connected between the gate and source terminal of the low-voltage depletion mode HEMT. The drain terminal of the depletion mode HEMT may be connected to the control terminal of the GaN chip and the gate terminal of the depletion mode HEMT is connected to the internal gate terminal of the active heterojunction transistor (high voltage HEMT).

In similar embodiments of the turn-on circuit more than one resistive element or current source may be used.

In similar embodiments of the turn-on circuit, passive elements could be included in parallel or in series to the said resistive elements and/or the current sources to improve the dynamic characteristic during the device turn-on transients. In other embodiments said passive elements are not monolithically integrated but can be included at package level or system level. In some of these embodiments the input of the turn-on circuit may not be monolithically connected to the first external control terminal but rather the GaN chip may comprise an additional terminal which acts as the input of the turn-on circuit. In other embodiments one of the inputs of the turn-on circuit may be monolithically connected to the first external control terminal but may also comprise an additional external terminal which can act as a second input to the turn-on circuit.

In other embodiments of the turn-on circuit additional diodes or low voltage heterojunction transistors may be used in series with the aforementioned resistive element and/or current source.

The integrated turn-off circuit (turn-off block) may be a heterojunction transistor (and more specifically a low voltage heterojunction transistor) connected in series between the GaN chip control terminal and the internal gate terminal where the drain terminal of the transistor is connected to the control terminal and the source terminal of the transistor is connected to internal gate terminal of the active heterojunction transistor.

In embodiments where the turn-off circuit transistor is a depletion mode transistor the gate terminal of the turn-off transistor may be operatively connected to the low voltage terminal of the high voltage transistor.

In embodiments where the turn-off circuit transistor is an enhancement mode transistor the gate terminal of the turn-off transistor may be operatively connected to the internal gate terminal of active heterojunction transistor.

In other embodiments a combination of depletion mode and enhancement mode transistors may be used.

The drain and source terminal of the low voltage transistor in the turn-off circuit may be interchangeable as the low voltage transistor may have a largely symmetrical design.

Optionally, the power semiconductor based heterojunction device may further comprise one or more monolithically integrated temperature compensated circuits. The one or more monolithically integrated temperature compensated circuits may comprise a low voltage heterojunction transistor, a first resistor connected in series with the low-voltage heterojunction transistor, and a second resistor connected in parallel with the low-voltage heterojunction transistor. The one or more monolithically integrated temperature compensated circuit may each reduce an effect of variations in temperature on a circuit behaviour of connected components.

According to a further aspect of the present disclosure, there is provided A method of manufacturing a III-nitride semiconductor based heterojunction power device, the method comprising:

forming an active heterojunction power transistor on a substrate, the active heterojunction transistor comprising:
   a first III-nitride semiconductor region comprising a first heterojunction comprising an active two dimensional carrier gas;
   a first terminal operatively connected to the III-nitride semiconductor region;
   a second terminal laterally spaced from the first terminal and operatively connected to the III-nitride semiconductor region;
   an active gate region formed over the III-nitride semiconductor region, the active gate region being formed between the first terminal and the second terminal;
forming a first auxiliary heterojunction transistor on the substrate or on a further substrate, the auxiliary heterojunction transistor comprising:
   a second III-nitride semiconductor region comprising a second heterojunction comprising an auxiliary two dimensional carrier gas;
   a first additional terminal operatively connected to the second III-nitride semiconductor region;
   a second additional terminal laterally spaced from the first additional terminal and operatively connected to the second III-nitride semiconductor region;
   an auxiliary gate region formed over the second III-nitride semiconductor region, the auxiliary gate region being formed between the first additional terminal and the second additional terminal;
forming a second auxiliary heterojunction transistor on the substrate or the further substrate,
operatively connecting the first additional terminal with the auxiliary gate region, and
operatively connecting the second additional terminal with the active gate region,
operatively connecting the second auxiliary heterojunction transistor in parallel with the first auxiliary transistor,
operatively connecting the first additional terminal of the first auxiliary heterojunction transistor to a source terminal of the second auxiliary heterojunction transistor, and
operatively connecting the second additional terminal of the first auxiliary heterojunction transistor to a drain terminal of the second auxiliary heterojunction transistor.

The method may further comprise forming an isolator region between the active heterojunction transistor and auxiliary heterojunction transistor separating the active two dimensional carrier gas and the auxiliary two dimensional carrier gas.

The method may further comprise forming the first III-nitride semiconductor region at the same time as forming the second III-nitride semiconductor region.

The method may further comprise forming the active gate region at the same time as forming the auxiliary gate region.

The method may further comprise forming a metallization layer for the first terminal, the second terminal, the first additional terminal, and the second additional terminal at the same time.

BRIEF DESCRIPTION OF THE PREFERRED EMBODIMENTS

The present disclosure will be understood more fully from the detailed description that follows and from the accompanying drawings, which however, should not be taken to limit the disclosure to the specific embodiments shown, but are for explanation and understanding only.

Figure 6:
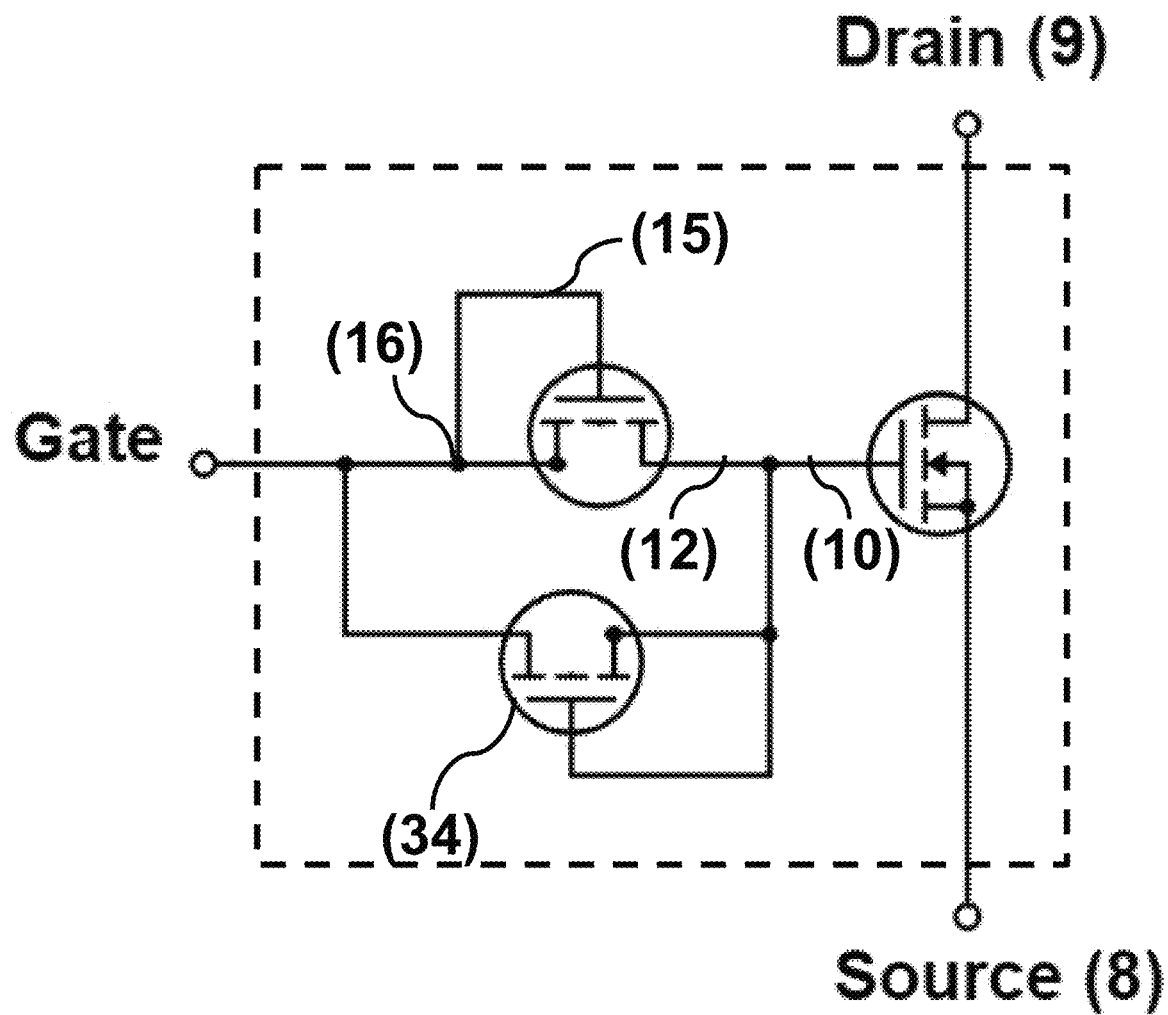
Figure 7:
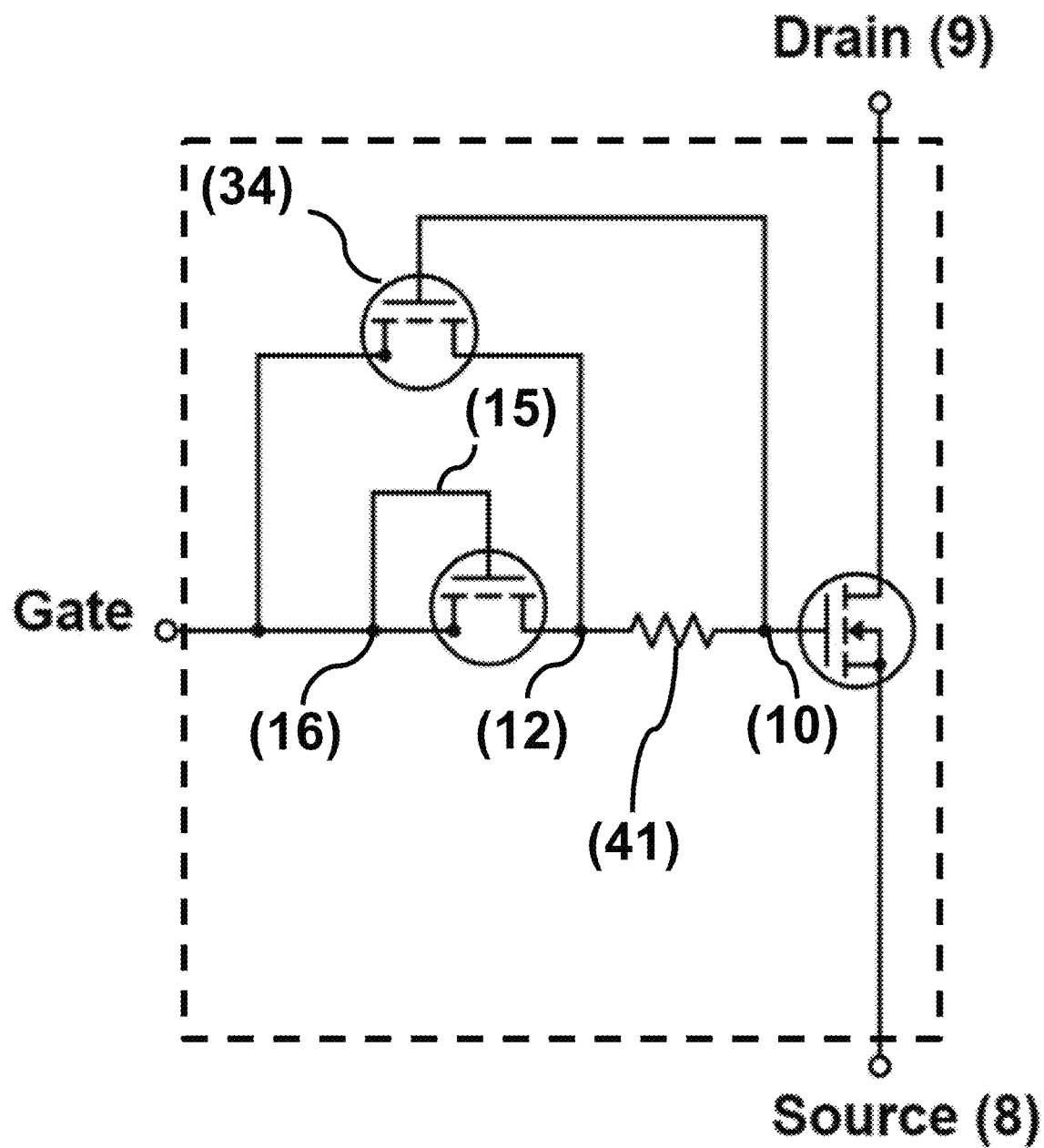
Figure 8:
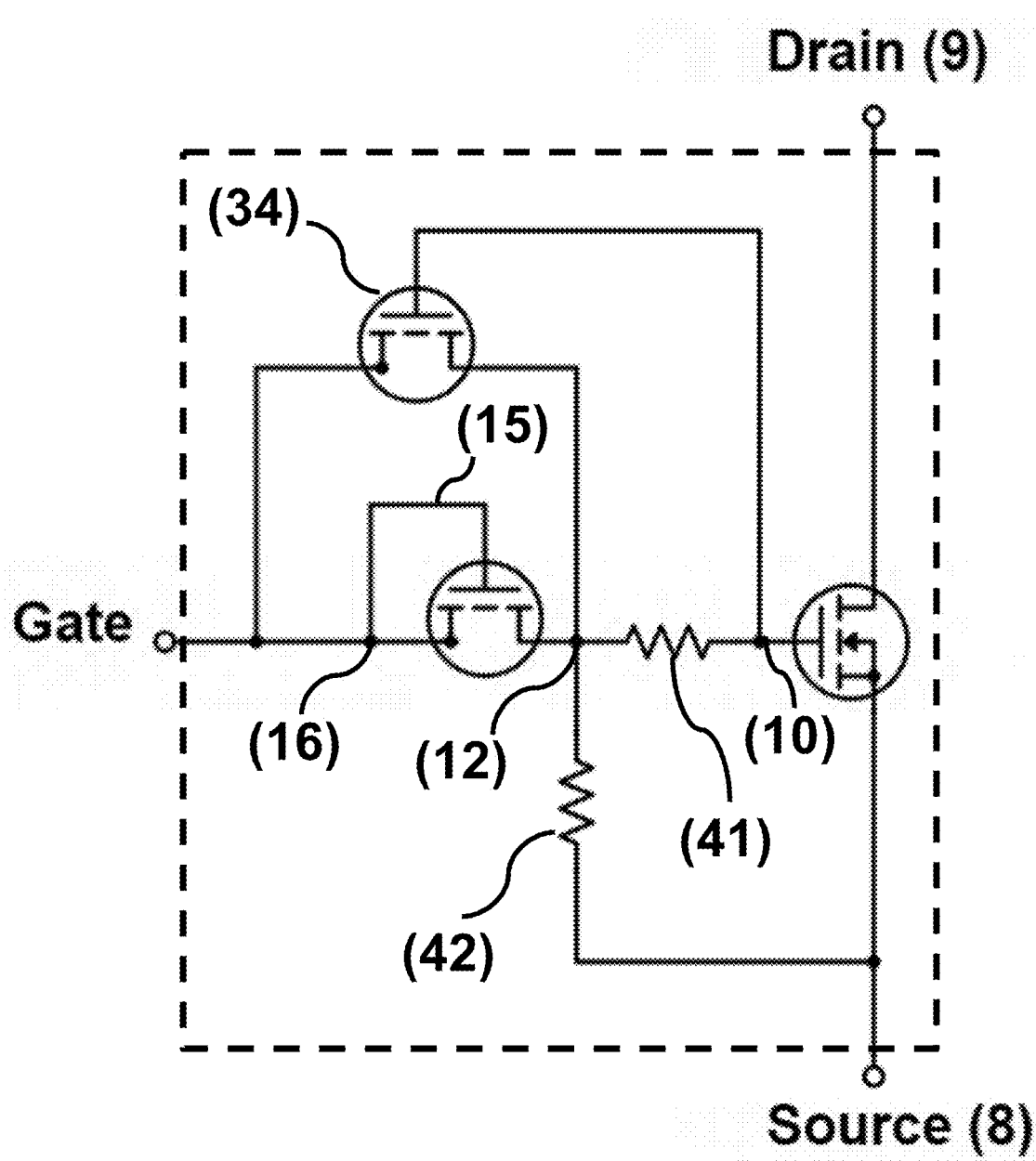
Figure 9:
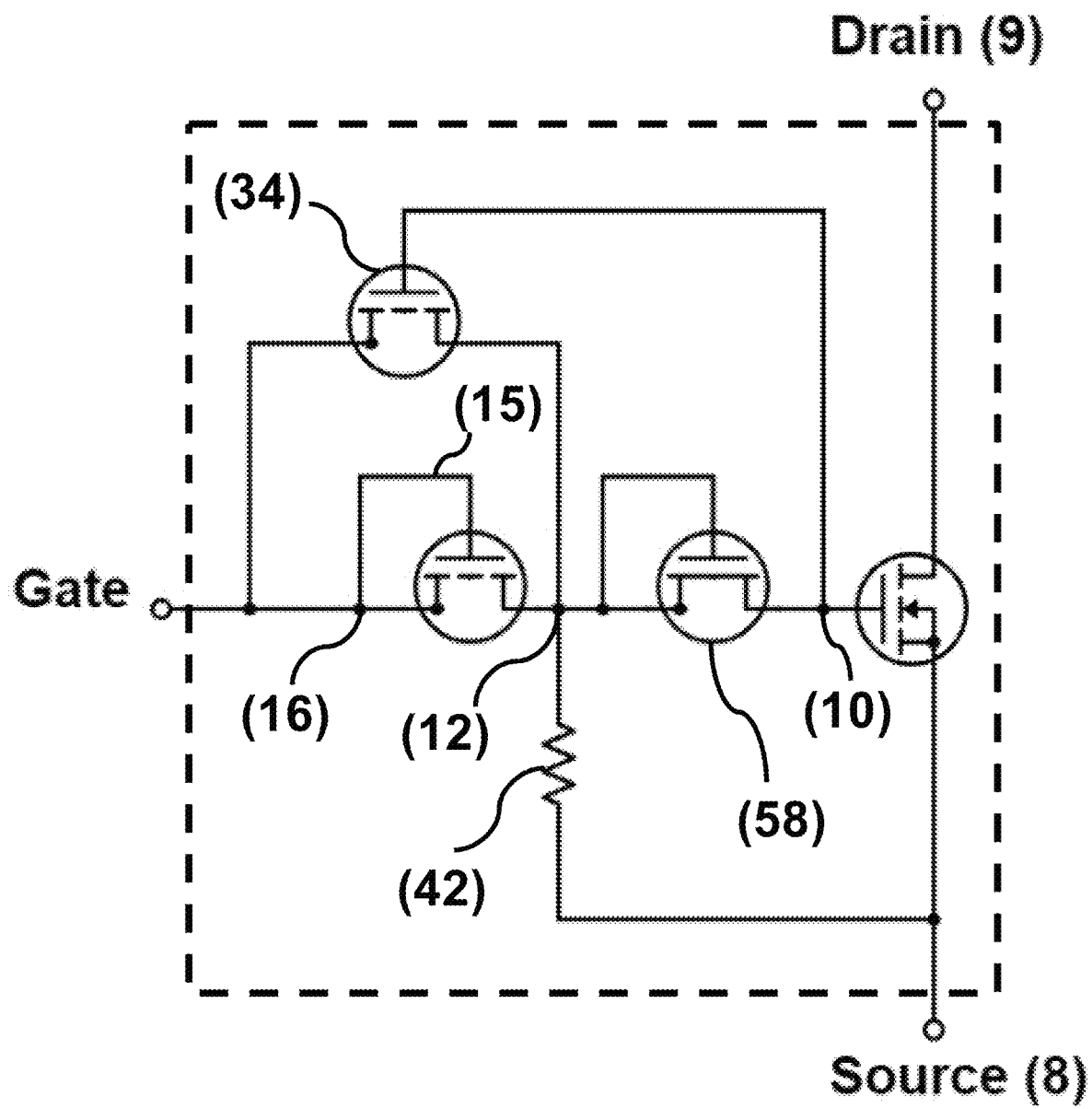
Figure 10:
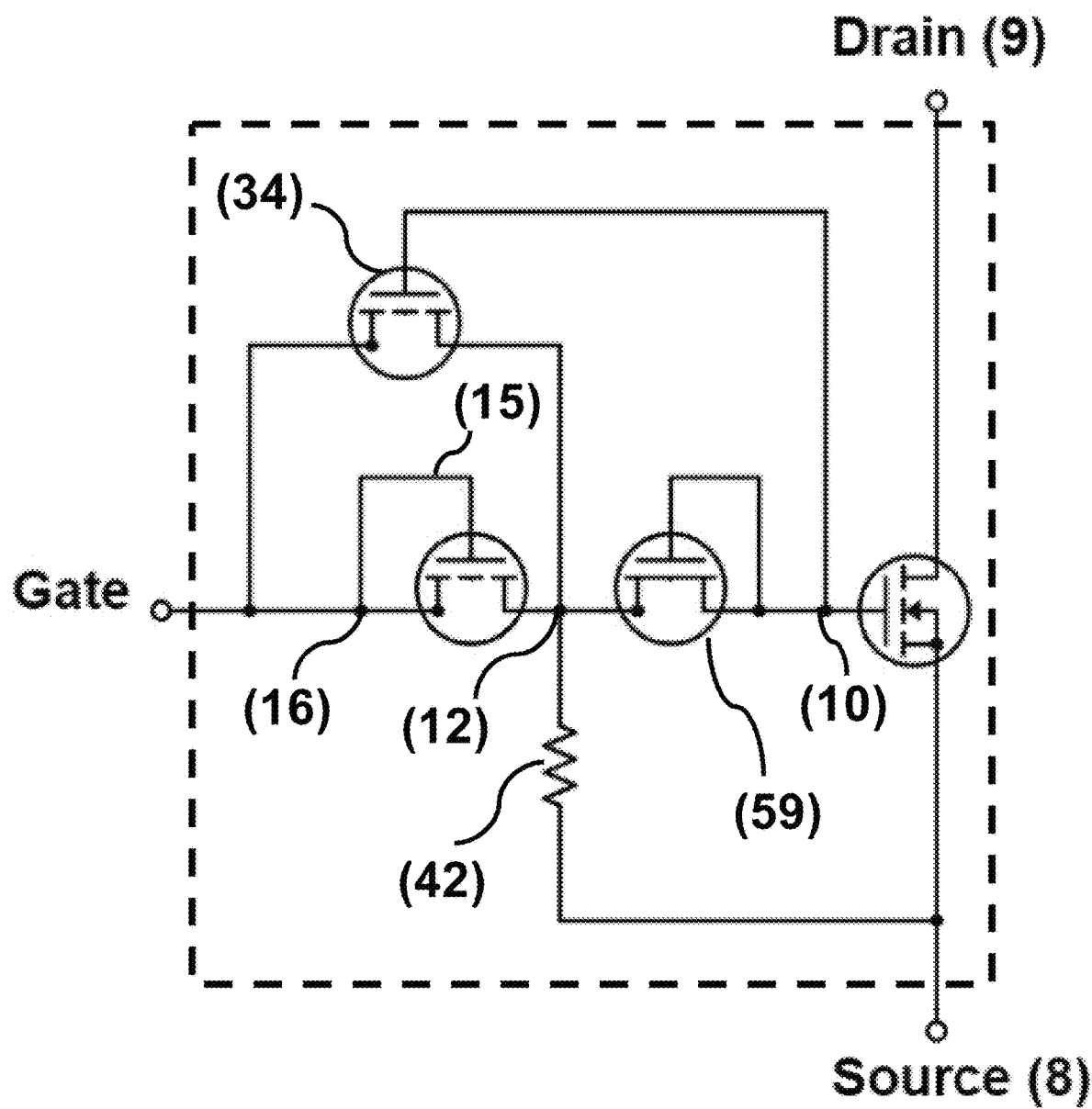
Figure 11:
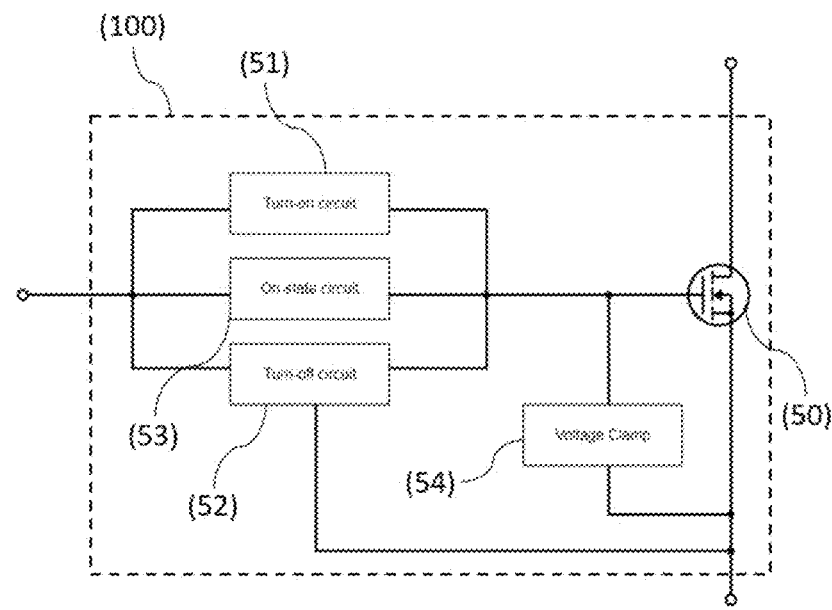

FIG. 6 shows a circuit schematic representation of a further embodiment of the proposed disclosure where a second auxiliary transistor is connected in parallel with a first auxiliary transistor where the drain (gate) terminal of the first low auxiliary transistor is connected to the source terminal of the second auxiliary transistor and the source terminal of the first auxiliary transistor is connected to the drain (gate) terminal of the second auxiliary transistor;

FIG. 7 shows a circuit schematic representation of a further embodiment of the proposed disclosure where a resistor is added between the drain terminal and gate terminal of the second auxiliary transistor;

FIG. 8 shows a circuit schematic representation of a further embodiment of the proposed disclosure where an additional resistor is added between the source terminal of the auxiliary transistor (drain terminal of the second auxiliary transistor) and source terminal of the active device;

FIG. 9 shows a circuit schematic representation of a further embodiment of the proposed disclosure where a third auxiliary transistor is added between the drain terminal and gate terminal of the second auxiliary transistor. The gate terminal of the third auxiliary transistor is connected to the source terminal of the third auxiliary transistor;

FIG. 10 shows a circuit schematic representation of a further embodiment of the proposed disclosure where a third auxiliary transistor is added between the drain terminal and gate terminal of the second auxiliary transistor. The gate terminal of the third auxiliary transistor is connected to the drain terminal of the third auxiliary transistor;

FIG. 11 shows a circuit schematic representation of one embodiment of the proposed disclosure which comprises a power semiconductor heterojunction device comprising an active high voltage heterojunction transistor, a turn-on circuit, an on-state circuit, a turn-off circuit and a voltage clamp circuit.

Figure 12A:
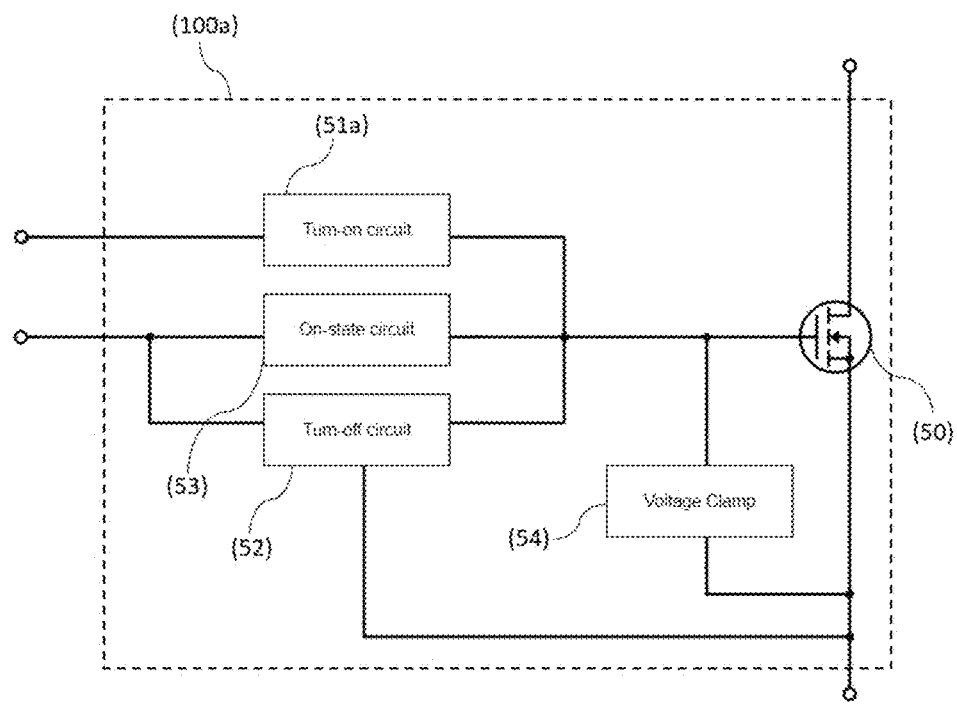

FIG. 12A shows a circuit schematic representation of one embodiment of the proposed disclosure similar to FIG. 11 but comprises an additional external terminal.

Figure 12B:
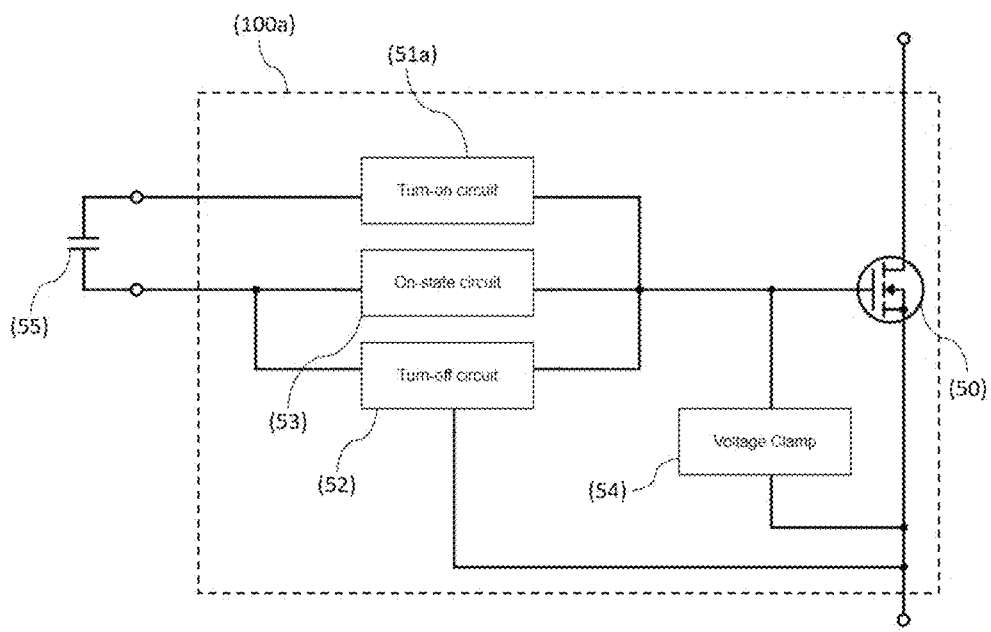

FIG. 12B shows a circuit schematic representation of one embodiment of the proposed disclosure similar to FIG. 12A and a capacitor connected between the first external control terminal and the aforementioned additional external terminal.

Figure 13A:
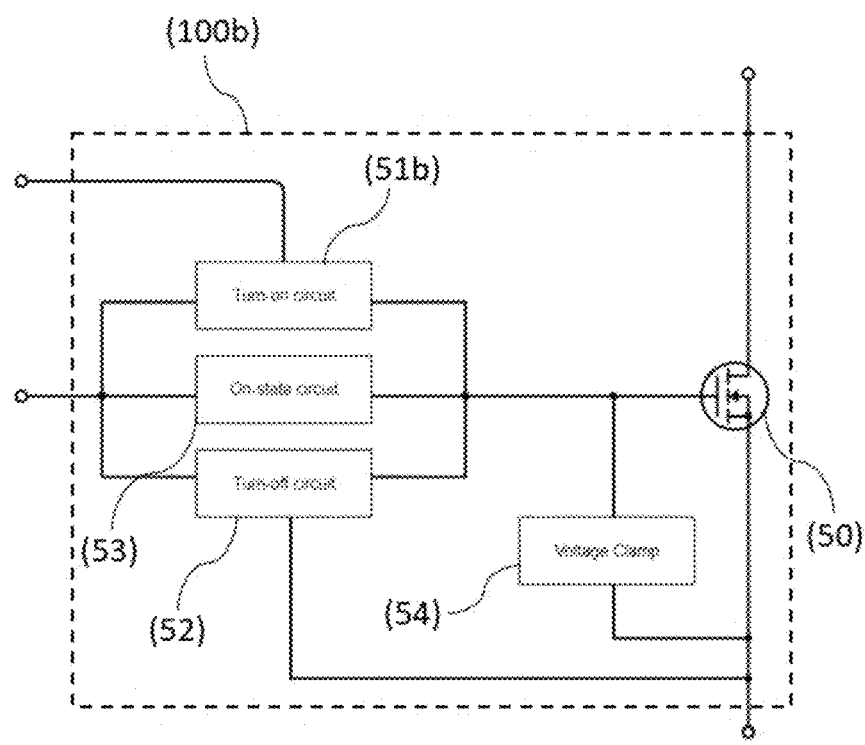

FIG. 13A shows a circuit schematic representation of one embodiment of the proposed disclosure similar to FIG. 11 but comprises an additional external terminal.

Figure 13B:
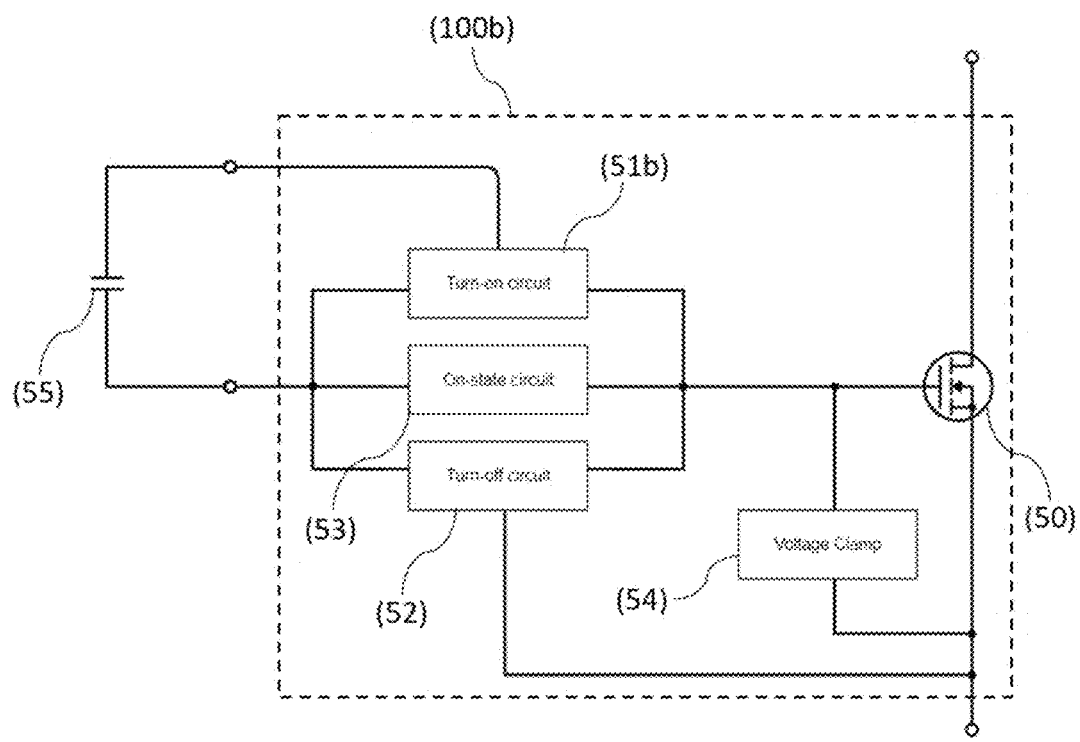

FIG. 13B shows a circuit schematic representation of one embodiment of the proposed disclosure similar to FIG. 13A and a capacitor connected between the first external control terminal and the aforementioned additional external terminal.

Figure 14A:
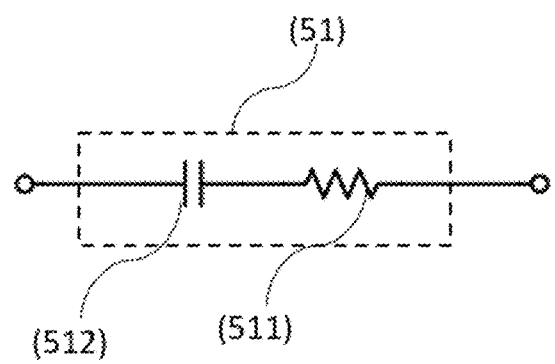

FIG. 14A shows a circuit schematic representation of one embodiment of the turn-on circuit which comprises a resistor and capacitor.

Figure 14B:
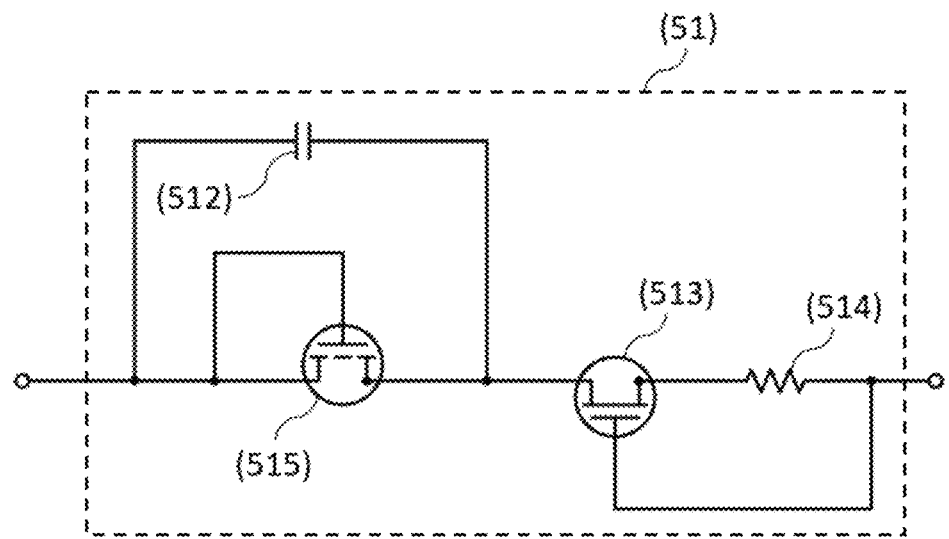

FIG. 14B shows a circuit schematic representation of another embodiment of the turn-on circuit which comprises a capacitor, a current source and a source/gate connected transistor.

Figure 15:
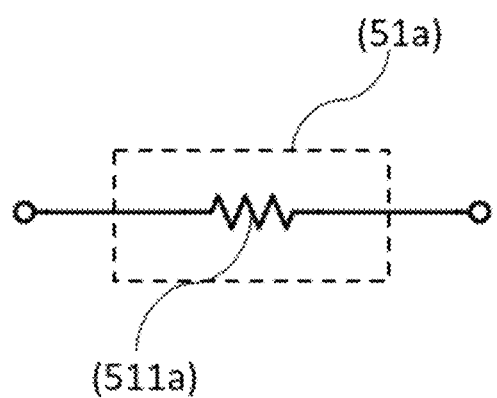

FIG. 15 shows a circuit schematic representation of one embodiment of the turn-on circuit which comprises a resistor.

Figure 16:
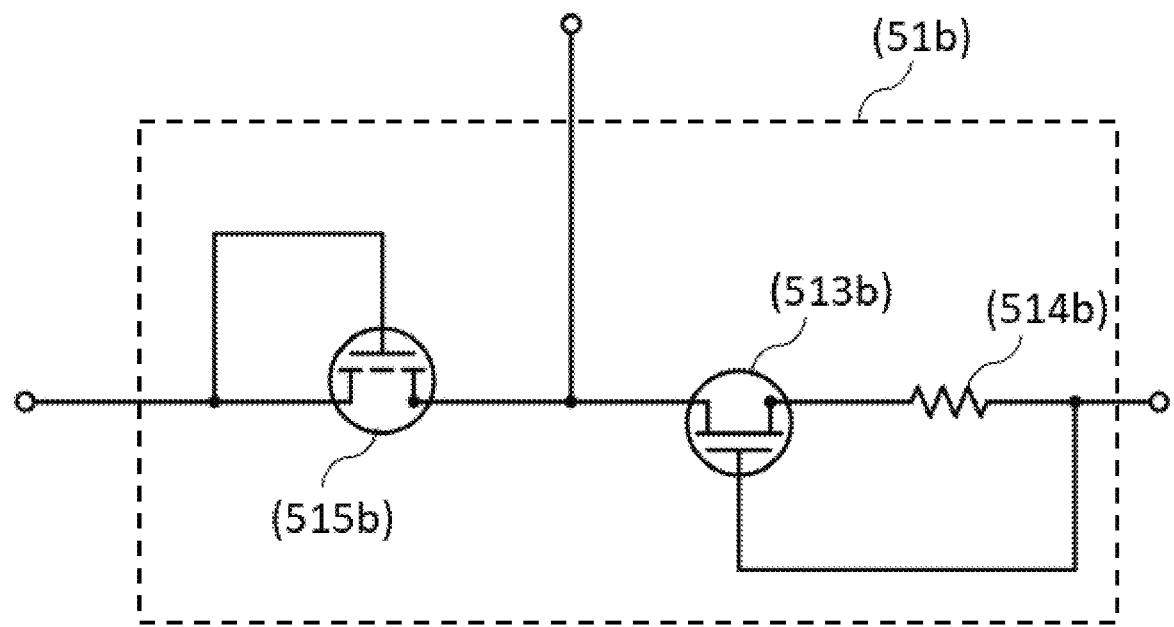

FIG. 16 shows a circuit schematic representation of one embodiment of the turn-on circuit which comprises a current source and a source/gate connected transistor.

Figure 17A:
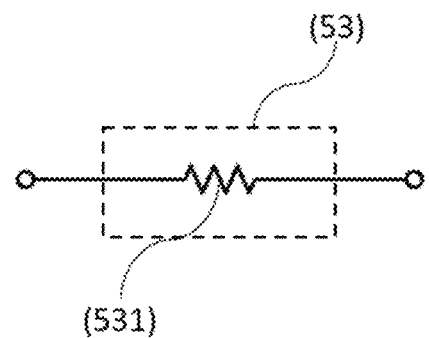

FIG. 17A shows a circuit schematic representation of one embodiment of the on-state circuit which comprises a resistor.

Figure 17B:
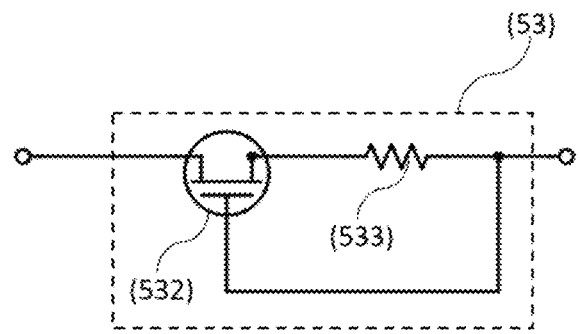

FIG. 17B shows a circuit schematic representation of another embodiment of the on-state circuit which comprises a current source.

Figure 18A:
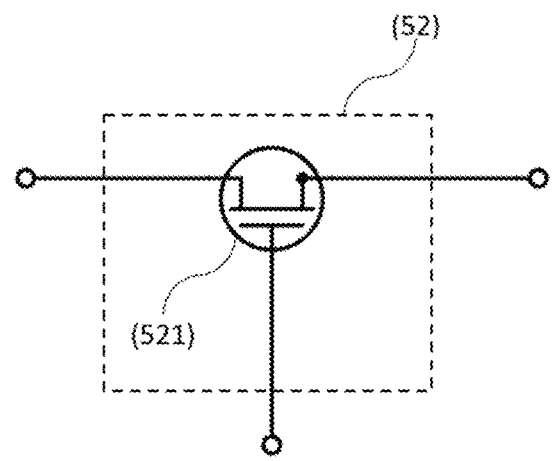

FIG. 18A shows a circuit schematic representation of one embodiment of the turn-off circuit which comprises a depletion mode transistor.

Figure 18B:
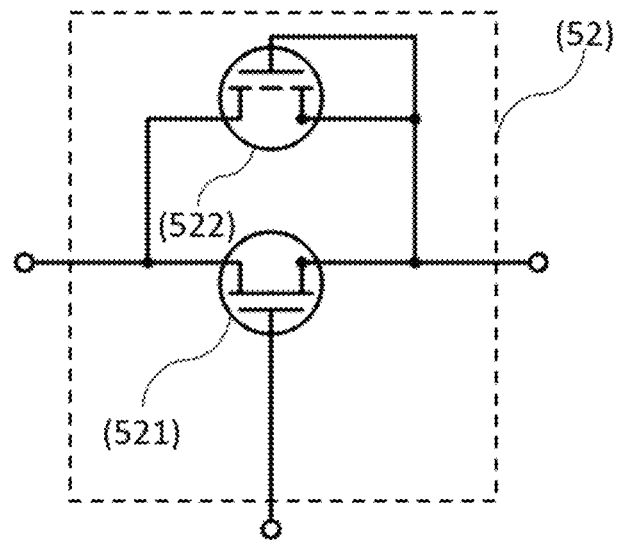

FIG. 18B shows a circuit schematic representation of an additional embodiment of the turn-off circuit similar to FIG. 18A which further comprises an enhancement mode transistor.

Figure 18C:
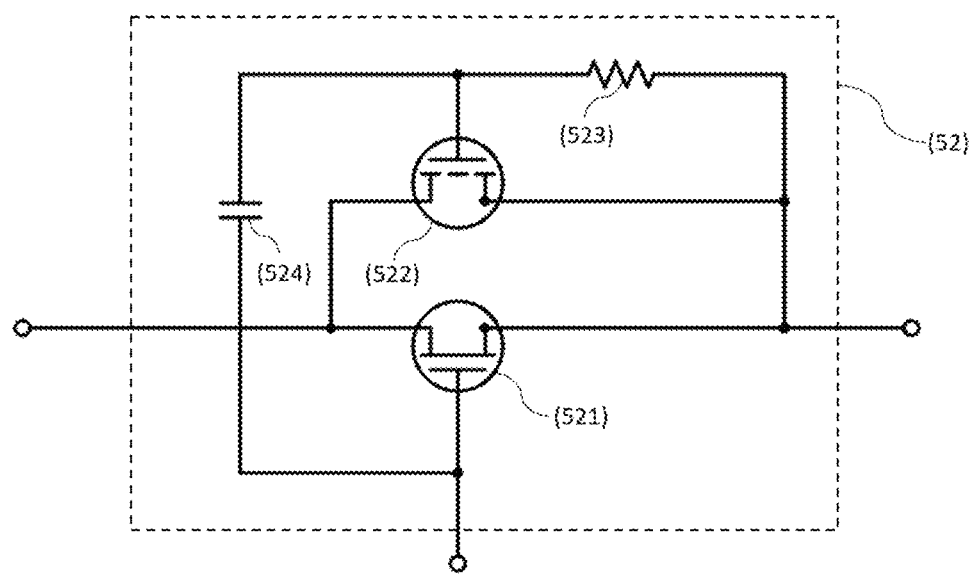

FIG. 18C shows a circuit schematic representation of an additional embodiment of the turn-off circuit similar to FIG. 18B which further comprises a resistor and capacitor.

Figure 19A:
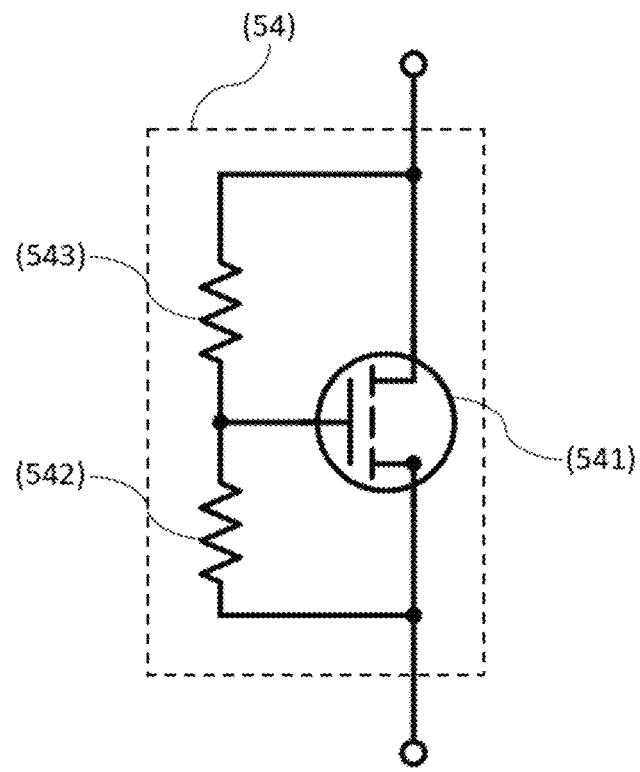

FIG. 19A shows a circuit schematic representation of one embodiment of the voltage clamp circuit.

Figure 19B:
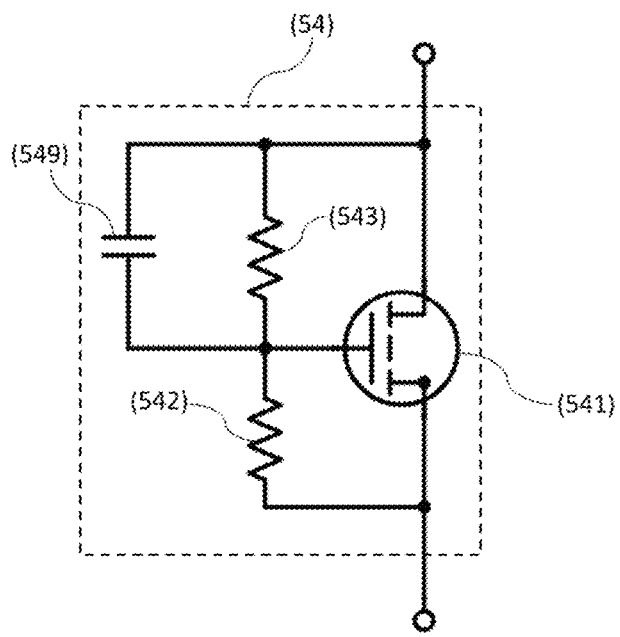

FIG. 19B shows a circuit schematic representation of an additional embodiment of the voltage clamp circuit similar to FIG. 19A which further comprises a capacitor.

Figure 19C:
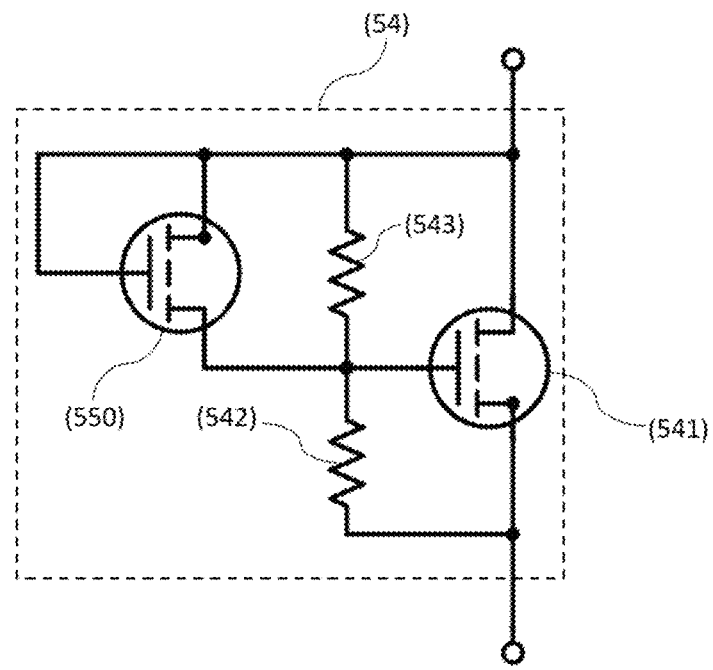

FIG. 19C shows a circuit schematic representation of an additional embodiment of the voltage clamp circuit similar to FIG. 19A which further comprises a source-gate connected enhancement mode transistor.

Figure 19D:
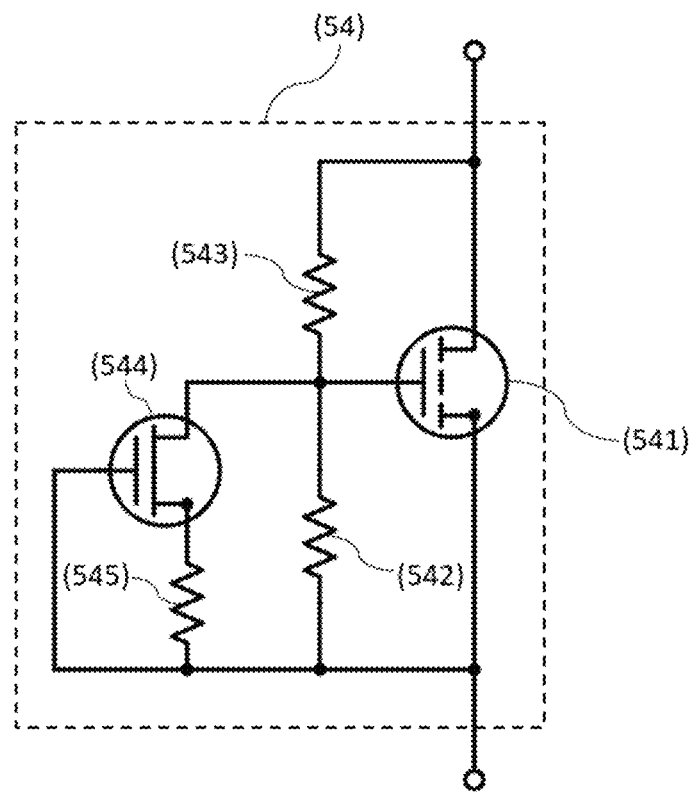

FIG. 19D shows a circuit schematic representation of an additional embodiment of the voltage clamp circuit similar to FIG. 19A which further comprises a temperature compensation circuit.

Figure 20:
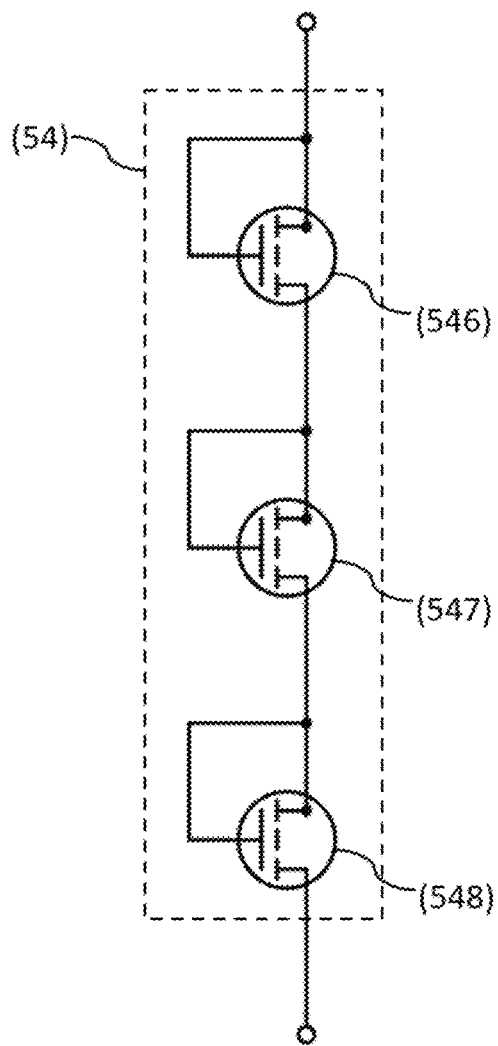

FIG. 20 shows a circuit schematic representation of an additional embodiment of the voltage clamp circuit which comprises source/gate connected transistors.

DETAILED DESCRIPTION OF THE PREFERRED EMBODIMENTS

Figure 1:
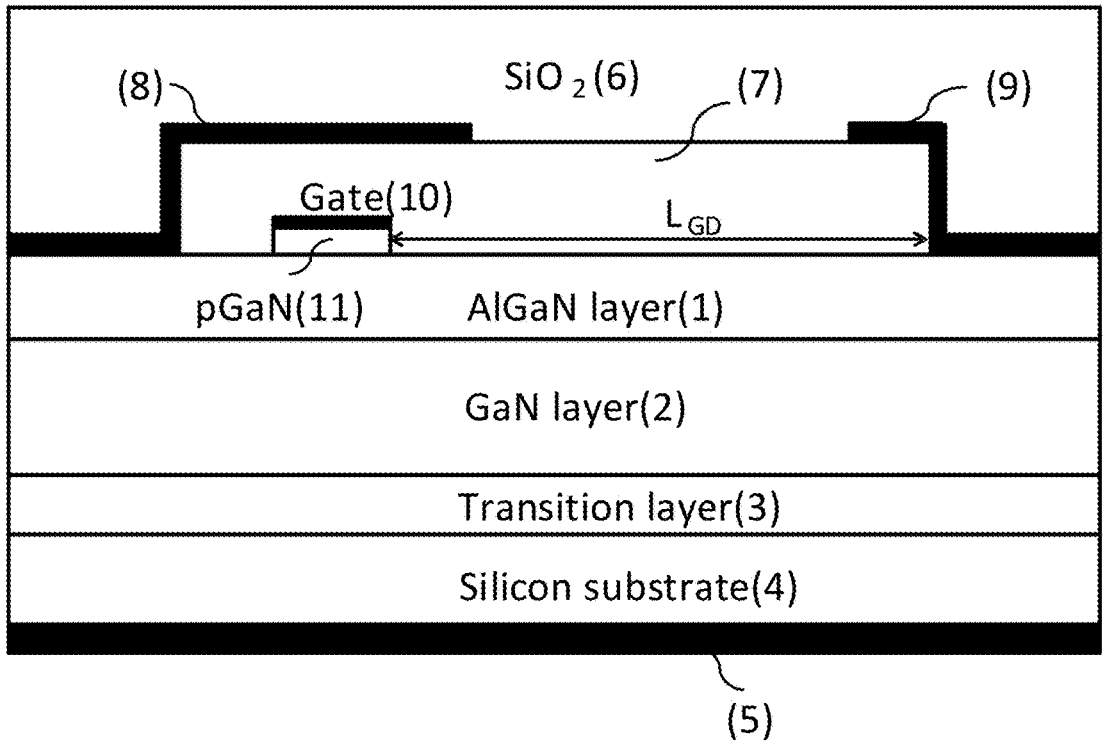
FIG. 1 shows schematically the cross section in the active area of a prior art pGaN HEMT.
Figure 2:
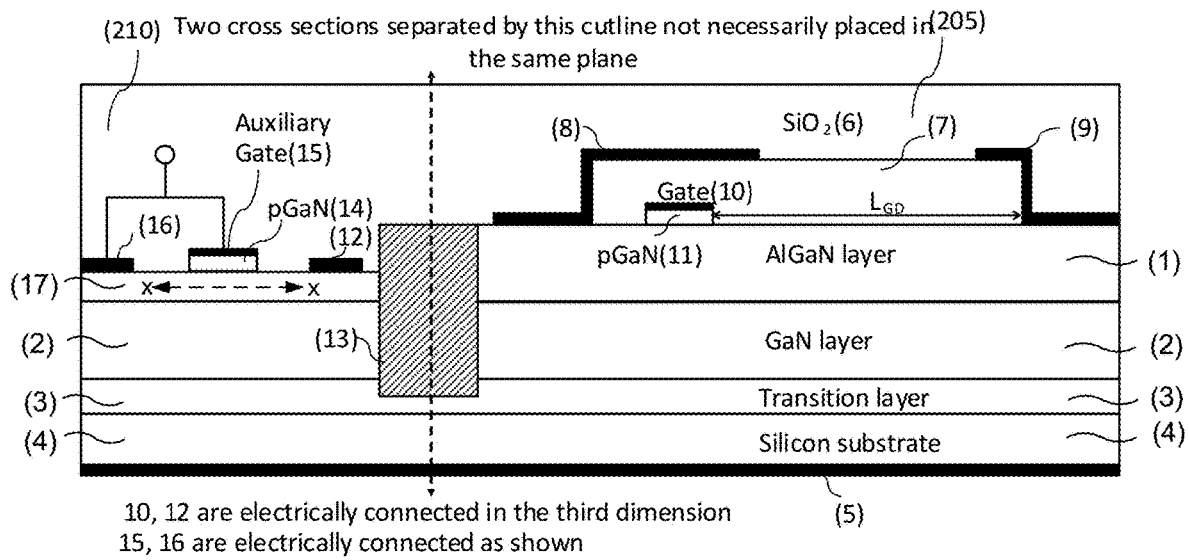
FIG. 2 illustrates a schematic representation of a cross section of the active area of the proposed disclosure according to one embodiment of the disclosure.

FIG. 2 illustrates a schematic representation of a cross section of the active area of the proposed disclosure, according to one embodiment of the disclosure. In use the current flows in the active area of the semiconductor device. In this embodiment, the device comprises a semiconductor (e.g. silicon) substrate 4 defining a major (horizontal) surface at the bottom of the device. Below the substrate 4 there is a substrate terminal 5. The device includes a first region of a transition layer 3 on top of the semiconductor substrate 4. The transition layer 3 comprises a combination of III-V semiconductor materials acting as an intermediate step to allow the subsequent growth of regions of high quality III-V semiconductor materials.

On top of the transition layer 3 there exists a second region 2. This second region 2 is of high quality III-V semiconductor (for example GaN) and comprises several layers. A third region 1 of III-V semiconductor containing a mole fraction of Aluminium is formed on top of the second region 2. The third region 1 is formed such that a heterostructure is formed at the interface between the second 2 and third region 1 resulting in the formation of a two dimensional electron gas (2DEG).

A fourth region of highly p-doped III-V semiconductor 11 is formed in contact with the third region 1. This has the function of reducing the 2DEG carrier concentration when the device is unbiased, and is pGaN material in this embodiment. A gate control terminal 10 is configured over the fourth region 11 in order to control the carrier density of the 2DEG at the interface of the second 2 and third region 1. A high voltage drain terminal 9 is arranged in physical contact with the third region 1. The high voltage drain terminal forms an ohmic contact to the 2DEG. A low voltage source terminal 8 is also arranged in physical contact with the third region 1 and also forms an ohmic contact to the 2DEG.

A portion of surface passivation dielectric 7 is formed on top of the fourth region 1 and between the drain terminal 9 and source terminal 8. A layer of $SiO_2$ passivation 6 is formed above the surface passivation dielectric 7 and source and drain terminals 8, 9.

The device is separated into two cross sections by a vertical cutline. The two cross sections may not be necessarily placed in the same plane. The features described above are on one side (right hand side, for example) of the vertical cutline. This is termed as the active device 205. The other side of the vertical cutline (the left hand side, for example) is termed as the auxiliary device 210, which also comprises a semiconductor substrate 4, a transition layer 3, a second region 2 and a $SiO_2$ passivation region 6.

A fifth region of III-V semiconductor 17 containing a mole fraction of Aluminium is positioned above the second region 2 in the auxiliary device such that a hetero-structure is formed at the interface between this fifth region 17 and the second region 2. This results in the formation of a second two dimensional electron gas (2DEG) in a region which will be referred to as the auxiliary gate. This AlGaN layer 17 of the auxiliary device 210 can be identical or different to the AlGaN layer 1 in the active device 205. The AlGaN layer thickness and Al mole fraction are critical parameters as they affect the carrier density of electrons in the 2DEG [15].

A sixth region of highly p-doped III-V semiconductor 14 is formed on top of and in contact with the fifth region 17. This has the function of reducing the 2DEG carrier concentration when the auxiliary gate is unbiased. An auxiliary gate control terminal 15 is configured over the sixth region 14 in order to control the carrier density of the 2DEG at the interface of the fifth 17 and second region 2. The auxiliary gate pGaN layer 14 may be identical or different to the active gate pGaN layer 11. Critical parameters which could differ include, but are not limited to, pGaN doping and width along the x-axis (shown in the figure).

An isolation region 13 is formed down the vertical cutline. This cuts the electrical connection between the 2DEG formed in the active device 205 and the 2DEG formed in the auxiliary device 210.

A first additional terminal 16 is arranged on top of and in physical contact with the fifth region 17 of the auxiliary device 210. This forms an ohmic contact to the 2DEG of the auxiliary device 210 and is also electrically connected (via interconnection metal) to the auxiliary gate control terminal 15 configured over the sixth region (pGaN) 14. The first additional terminal 16 is biased at the same potential as the auxiliary gate terminal 15 of the auxiliary device. A second additional terminal 12 is also arranged on top of and in physical contact with the fifth region 17 of the auxiliary device 210. This forms an ohmic contact to the 2DEG of the auxiliary device 210 and is electrically connected (via interconnection metal) to the active gate control terminal 10 configured over the fourth region 11 of the active device 205. The interconnection between the second additional terminal 12 of the auxiliary device 210 and the active gate terminal 10 of the active device 205 can be made in the third dimension and can use different metal layers in the process. Note that this interconnection is not shown in the schematic in FIG. 2. A similar but not necessarily identical AlGaN/GaN structure is used in the auxiliary gate.

When the device is in use the auxiliary gate 14, 15 drives the active gate 10, 11. The auxiliary 2DEG layer formed between the first and second additional terminals 12, 16 with the portion under the auxiliary p-GaN gate 14 is controlled by the potential applied to the auxiliary gate terminal 15.

The portion of the auxiliary 2DEG under the auxiliary pGaN gate 14 is depleted when the auxiliary gate terminal 15 and the short-circuited first additional terminal 16 are at 0V. As the auxiliary gate bias is increased (both terminals 15, 16) the 2DEG starts forming under the pGaN gate 14 connecting to the already formed 2DEG layer which connects to the first and second additional terminals 16, 12. A 2DEG connection is now in place between the first and second additional terminals 12, 16.

As the second additional terminal 12 is connected to the active gate 10 the device can now turn on. A positive (and desirable) shift in the device threshold voltage is observed using this structure as not all of the potential applied to the auxiliary gate 15 is transferred to the active gate 10. Part of this potential is used to form the auxiliary 2DEG under the auxiliary gate 15 and only part is transferred to the second additional terminal 12 which is connected to the active gate 10.

The auxiliary gate provides the additional advantage of being able to control the gate resistance of the device more easily. This can be achieved by varying the field plate design or distance between terminals 12 and 15 or 15 and 16. This can be useful in controlling the unwanted oscillations observed due to the fast switching of these devices. Different embodiments of the device can include terminals 10, 15 being either Schottky or Ohmic contacts or any combination of those two.

Figure 3:
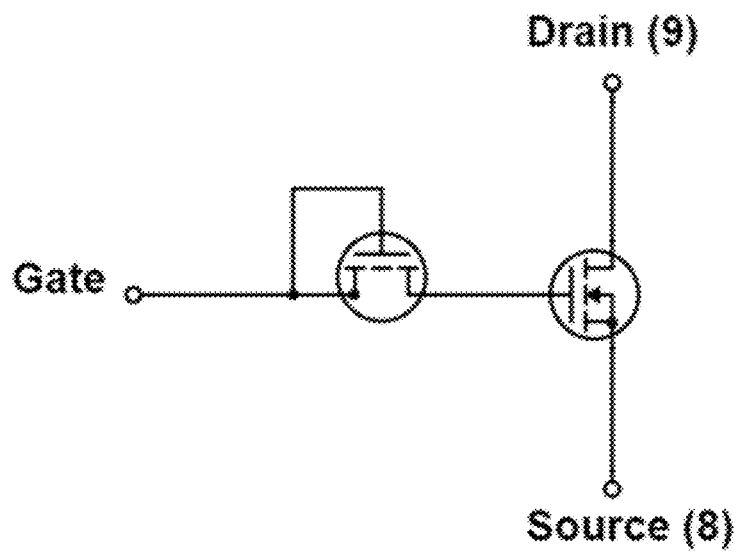
FIG. 3 shows a circuit schematic representation of one embodiment of the proposed disclosure as shown in the schematic cross section of FIG. 2.

FIG. 3 shows a circuit schematic representation of one embodiment of the proposed disclosure as shown in the schematic cross section of FIG. 2. The features shown in FIG. 3 carry the same reference numbers as the features in FIG. 2.

Figure 4A:
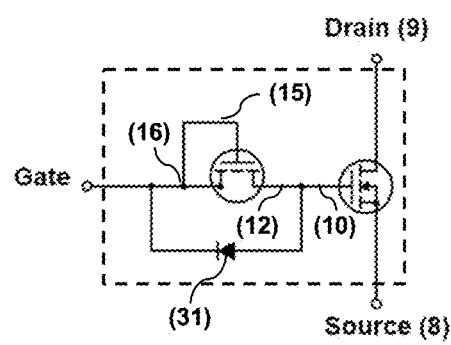
FIG. 4A shows a circuit schematic representation of a further embodiment of the proposed disclosure in which a low on-state voltage diode is connected in parallel between the drain and the source of the auxiliary transistor.
Figure 4B:
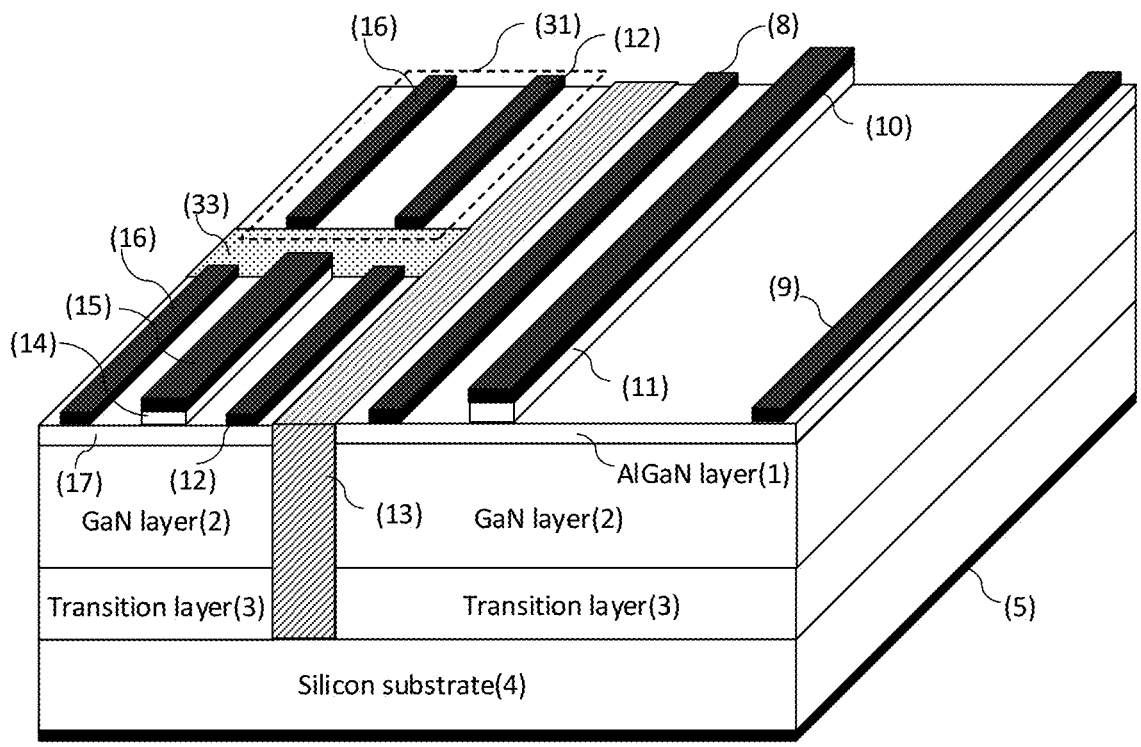
FIG. 4B illustrates a 3D schematic representation of the embodiment of FIG. 4A.
Figure 4C:
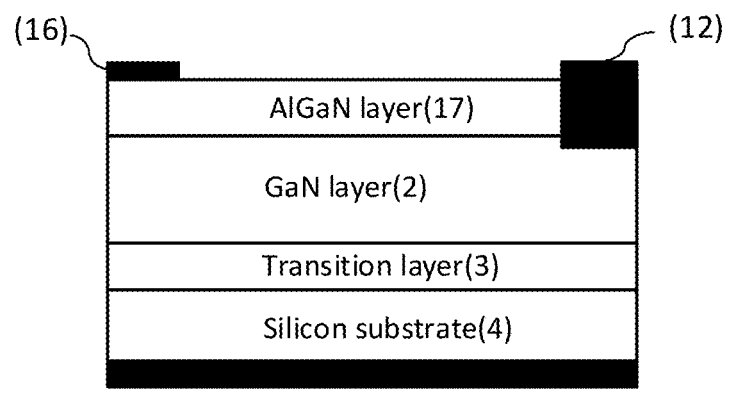
FIG. 4C shows the cross section of the low voltage diode as used in embodiment of FIG. 4A.
Figure 5:
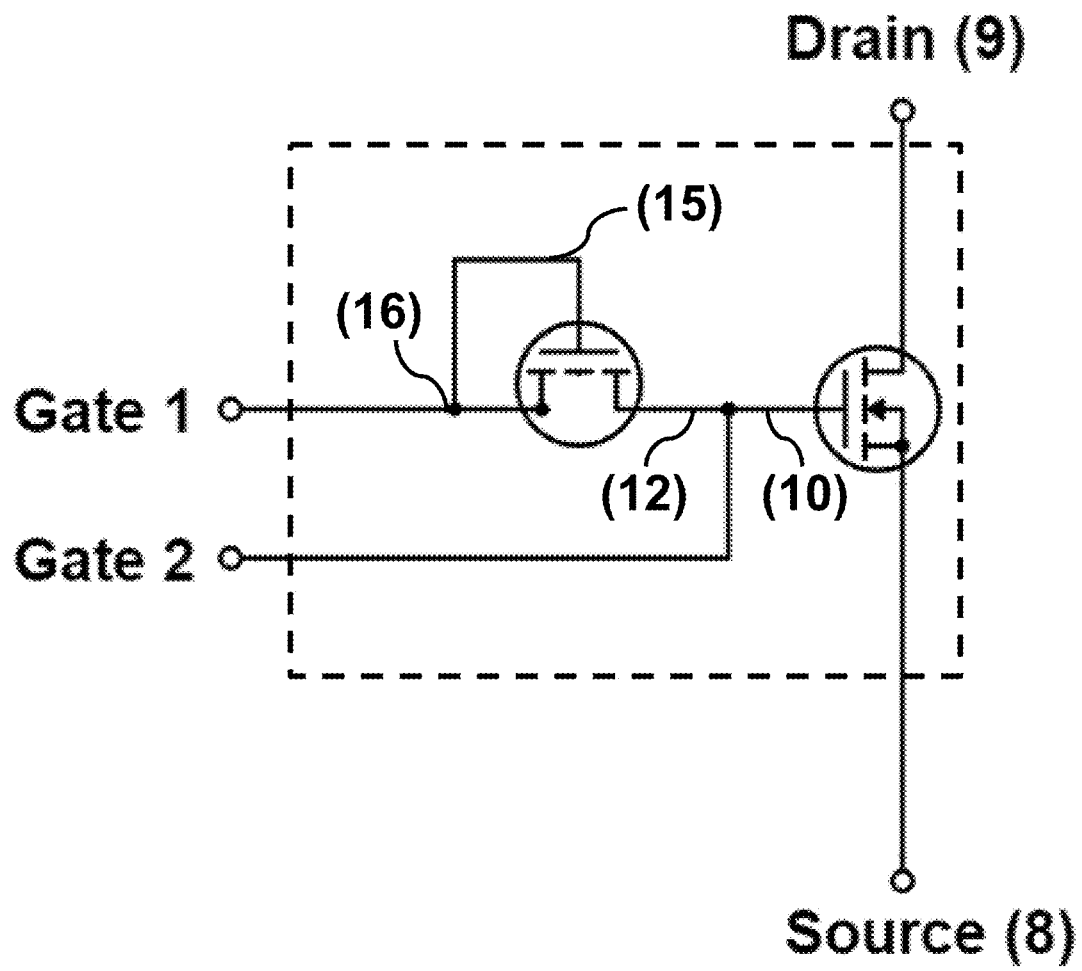
FIG. 5 shows a circuit schematic representation of a further embodiment of the proposed disclosure in which the drain (gate) terminal and the source terminal of the auxiliary transistor are available as external gate terminals.

FIG. 4A shows a circuit schematic representation of a further embodiment of the proposed disclosure in which a low on-state voltage diode is connected in parallel between the drain and the source of the auxiliary transistor, as shown in the schematic 3D illustration in FIG. 4B. Many of the features of this embodiment are similar to those of FIG. 2 and therefore carry the same reference numerals, i.e., the semiconductor substrate 4, substrate terminal 5, transition layer 3, GaN layer 2, AlGaN layer 1, active pGaN layer 11, active gate terminal 10, surface passivation dielectric 7, low voltage source terminal 8, high voltage drain terminal 9, SiO$_2$ passivation layer 6, isolation region 13, auxiliary AlGaN layer 17, auxiliary pGaN layer 14, auxiliary gate 15, first additional terminal 16 and second additional terminal 12. However, in this embodiment a low on-state voltage diode 31 is connected in parallel between the drain 16 and the source 12 of the auxiliary transistor. The parallel diode 31 acts as pull-down network during the turn-off of the overall configuration connecting to ground the gate terminal 10 of the active GaN transistor. When a positive bias (known as on-state) is applied to the auxiliary gate 15, the diode 31 will be reverse-biased and zero current will flow through it, leaving unaffected the electrical behaviour of the overall high-voltage configuration. When a zero bias (off-state) will be applied to the auxiliary gate 15 the diode 31 will be forward bias and the turn-off current flowing through it will discharge the gate capacitance of the active transistor, thus enabling the switching off of the overall configuration. In off-state, the gate of the active device 10 will remain biased to a minimum voltage equal to the turn-on voltage of the diode. The diode 31 will therefore be designed in such a way that its turn-on voltage will be as low as possible, ideally few mV. FIG. 4B illustrates how the diode 31 could be included monolithically. The diode could be a simple Schottky diode or could be a normal p-n diode. The diode 31 would pull down the active gate 10 during turn-off to the diode Vth, therefore the diode needs to be designed to have as low a threshold voltage as possible. A feature which can achieve this is the use of a recessed anode such that the contact is made directly to the 2DEG as seen in FIG. 4C. FIG. 5 shows a circuit schematic representation of a further embodiment of the proposed disclosure in which the drain (gate) terminal 16 and the source terminal 12 of the auxiliary transistor are available as external gate terminals. Many of the features of this embodiment are similar to those of FIG. 2 and therefore carry the same reference numerals, i.e., the semiconductor substrate 4, substrate terminal 5, transition layer 3, GaN layer 2, AlGaN layer 1, active pGaN layer 11, active gate terminal 10, surface passivation dielectric 7, low voltage source terminal 8, high voltage drain terminal 9, SiO$_2$ passivation layer 6, isolation region 13, auxiliary AlGaN layer 17, auxiliary pGaN layer 14, auxiliary gate 15, first additional terminal 16 and second additional terminal 12. However, in this case the external gate terminal is divided into two terminals. Since the gate driver sink output pin can now be connected to the source terminal of the auxiliary transistor directly offering a pull-down path, component 31 in FIG. 4 may (or may not) be omitted.

FIG. 6 shows a circuit schematic representation of a further embodiment of the proposed disclosure where a second auxiliary transistor 34 (could be advantageously low-voltage) is connected in parallel with the first auxiliary transistor where the drain (gate) terminal 16 of the first auxiliary transistor is connected to the source terminal of the second auxiliary transistor and the source terminal 12 of the first auxiliary transistor is connected to the drain (gate) terminal of the second auxiliary transistor. Many of the features of this embodiment are similar to those of FIG. 2 and therefore carry the same reference numerals, i.e., the semiconductor substrate 4, substrate terminal 5, transition layer 3, GaN layer 2, AlGaN layer 1, active pGaN layer 11, active gate terminal 10, surface passivation dielectric 7, low voltage source terminal 8, high voltage drain terminal 9, SiO$_2$ passivation layer 6, isolation region 13, auxiliary AlGaN layer 17, auxiliary pGaN layer 14, auxiliary gate 15, first additional terminal 16 and second additional terminal 12. However, in this case the pull-down network during the turn-off of the overall configuration is a second auxiliary transistor 34.

FIG. 7 shows a circuit schematic representation of a further embodiment of the proposed disclosure where a resistor 41 is added between the drain terminal 12 and gate terminal 10 of the second auxiliary transistor 34. Many of the features of this embodiment are similar to those of FIG. 6 and therefore carry the same reference numerals, i.e., the semiconductor substrate 4, substrate terminal 5, transition layer 3, GaN layer 2, AlGaN layer 1, active pGaN layer 11, active gate terminal 10, surface passivation dielectric 7, low voltage source terminal 8, high voltage drain terminal 9, $SiO_2$ passivation layer 6, isolation region 13, auxiliary AlGaN layer 17, auxiliary pGaN layer 14, auxiliary gate 15, first additional terminal 16, second additional terminal 12 and second auxiliary transistor 34. In this embodiment, the resistor 41 acts to reduce the active gate capacitance discharge time through the pull-down network during the turn-off of the active device. The additional resistor performs this function by creating an increased potential, during turn-off, of the second auxiliary transistor gate terminal 10 compared to the second auxiliary transistor drain terminal 12.

FIG. 8 shows a circuit schematic representation of a further embodiment of the proposed disclosure where an additional resistor 42 is added between the source terminal of the auxiliary transistor (drain terminal 12 of the second auxiliary transistor) and source terminal 8 of the active device. Many of the features of this embodiment are similar to those of FIG. 7 and therefore carry the same reference numerals, i.e., the semiconductor substrate 4, substrate terminal 5, transition layer 3, GaN layer 2, AlGaN layer 1, active pGaN layer 11, active gate terminal 10, surface passivation dielectric 7, low voltage source terminal 8, high voltage drain terminal 9, $SiO_2$ passivation layer 6, isolation region 13, auxiliary AlGaN layer 17, auxiliary pGaN layer 14, auxiliary gate 15, first additional terminal 16, second additional terminal 12, second auxiliary transistor 34 and resistive element 41. In this embodiment, the additional resistive element 42 acts as an additional pull-down network during the active device turn-off. During the active device turn-on and on-state the additional resistance 42 can act as a voltage limiting component to protect the gate terminal of the active device.

FIG. 9 shows a circuit schematic representation of a further embodiment of the proposed disclosure where a third auxiliary transistor 58 is added between the drain terminal 12 and gate terminal 10 of the second auxiliary transistor 34. Many of the features of this embodiment are similar to those of FIG. 8 and therefore carry the same reference numerals, i.e., the semiconductor substrate 4, substrate terminal 5, transition layer 3, GaN layer 2, AlGaN layer 1, active pGaN layer 11, active gate terminal 10, surface passivation dielectric 7, low voltage source terminal 8, high voltage drain terminal 9, SiO2 passivation layer 6, isolation region 13, auxiliary AlGaN layer 17, auxiliary pGaN layer 14, auxiliary gate 15, first additional terminal 16, second additional terminal 12, second auxiliary transistor 34 and additional resistive element 42. In this embodiment, the third auxiliary transistor acts to reduce the active gate capacitance discharge time through the pull-down network during the turn-off of the heterojunction power device. The third auxiliary transistor 58 performs this function by creating an increased potential, during turn-off, of the second auxiliary transistor gate terminal 10 compared to the second auxiliary transistor drain terminal 12. The third auxiliary transistor is a depletion mode device. The gate terminal of the third auxiliary transistor is connected to the source terminal of the third auxiliary transistor.

FIG. 10 shows a circuit schematic representation of a further embodiment of the proposed disclosure where a third auxiliary transistor 59 is added between the drain terminal 12 and gate terminal 10 of the second auxiliary transistor 34. Many of the features of this embodiment are similar to those of FIG. 8 and therefore carry the same reference numerals, i.e., the semiconductor substrate 4, substrate terminal 5, transition layer 3, GaN layer 2, AlGaN layer 1, active pGaN layer 11, active gate terminal 10, surface passivation dielectric 7, low voltage source terminal 8, high voltage drain terminal 9, SiO2 passivation layer 6, isolation region 13, auxiliary AlGaN layer 17, auxiliary pGaN layer 14, auxiliary gate 15, first additional terminal 16, second additional terminal 12, second auxiliary transistor 34 and additional resistive element 42. In this embodiment, the third auxiliary transistor acts to reduce the active gate capacitance discharge time through the pull-down network during the turn-off of the heterojunction power device. The third auxiliary transistor 59 performs this function by creating an increased potential, during turn-off, of the second auxiliary transistor gate terminal 10 compared to the second auxiliary transistor drain terminal 12. The third auxiliary transistor is a depletion mode device. The gate terminal of the third auxiliary transistor is connected to the drain terminal of the third auxiliary transistor.

FIG. 11 shows a circuit schematic representation of one embodiment of the proposed disclosure. This embodiment illustrates a power semiconductor heterojunction device comprising (GaN chip) 100 which comprises the high voltage heterojunction transistor (high voltage HEMT, or high voltage transistor) 50, a turn-on circuit 51, a turn-off-circuit 52, an on-state circuit 53 and a voltage clamp circuit 54.

The GaN chip illustrated comprises three terminals: a high voltage terminal, a low voltage terminal and a control terminal.

The GaN chip may be used in switch-mode electronic (power electronics) applications. As such the operation of the GaN chip may be divided into at least four modes of operation: turn-on, on-state, turn-off, off-state.

The GaN chip described herein may comprise additional circuitry connected to the internal gate terminal of the high voltage transistor in order to:
  optimize the operation of the overall device in the four different modes of operation thus enabling fast and reliable switching operation; and/or
  increase the gate driving operating range (when the operating range relates to the potential applied to the external control terminal). The wider range for the acceptable control signal applied by the gate driver may be achieved by limiting the maximum voltage signal level that may be applied to the internal gate terminal.

Examples of the internal circuitry of the blocks 51, 52, 53, 54 illustrated in FIG. 11 will be described in this disclosure. It will be appreciated that these examples are not exhaustive, and other variations will be apparent to the skilled person.

FIG. 12A shows a circuit schematic representation of an additional embodiment of the proposed disclosure. The GaN chip 100a in this embodiment is similar to the embodiment illustrated in FIG. 11 but contains an additional external control terminal. The additional external control terminal can allow non-monolithically integrated components to be connected between the first control terminal and the input to the turn-on circuit 51a as illustrated in FIG. 12B.

In FIG. 12B the additional component included is a capacitor 55. Large capacitance values may be difficult to integrate monolithically so might more suitably be included at package or system level. The series capacitor included in the turn-on path i.e. from the gate drive signal (applied to the first control terminal), through the capacitor 55, through turn-on circuit 51a to internal gate terminal can provide an appositely designed transient current through the turn-on path when the external control terminal signal goes from low to high. Furthermore, the design in this embodiment can prevent any significant current through the turn-on path during the period that the control signal is high i.e. the on-state period. Therefore, in this example the comparatively large transient current provided can allow a fast turn-on of the high voltage device however the current during the on-state period can be primarily provided through the on-state circuit 53 which can be optimized to minimise gate driver losses and long-term gate reliability.

FIG. 13A shows a circuit schematic representation of an additional embodiment of the proposed disclosure. The power heterojunction device (GaN chip) 100b in this embodiment is similar to the embodiment illustrated in FIG. 11 but contains an additional external control terminal. The additional external control terminal in this embodiment is operatively connected in the integrated circuit as a third terminal of the turn-on circuit 51b. The additional external control terminal may act as a second input for the turn-on circuit. The first input of the turn-on circuit in this embodiment is operatively connected to the first external control terminal (similar to the embodiment in FIG. 11). The additional external control terminal can allow non-monolithically integrated components to be connected between the first control terminal and the second input to the turn-on circuit as illustrated in FIG. 13B.

In FIG. 13B the additional component included is a capacitor 55. Large capacitance values may be difficult to integrate monolithically so might more suitably be included at package or system level.

FIG. 14A shows a circuit schematic representation of one embodiment of the turn-on circuit 51. In this embodiment the turn-on circuit comprises a capacitor 512 and a resistive element 511 in series.

FIG. 14B shows a circuit schematic representation of another embodiment of the turn-on circuit 51. In this embodiment the turn-on circuit comprises a capacitor 512, a current source 513, 514 and an enhancement mode transistor 515. Current source 513, 514 allows control over the maximum current that can flow through the turn-on circuit, the pre-designed value for this current can be easily adjusted through the choice of resistor 514. Capacitor 512 allows a significant current through the turn-on circuit 51 during the turn-on transient enabling fast turn-on while limiting the current during the on-state period when the potential of the external control terminal and the internal gate terminal reaches a steady state value. To avoid charging up of the capacitor node (i.e. node between transistor 513 and transistor 515) over several switching cycles, a source—gate connected transistor 515 can be introduced as illustrated in this example in order to reset/discharge the capacitor node to the potential of one threshold voltage of the source—gate connected transistor 515. In another embodiment not illustrated here a capacitor may be included in parallel to resistor 514 to provide an additional boost during the turn-on transient.

FIG. 15 shows a circuit schematic representation of one embodiment of the turn-on circuit 51a. In this embodiment the turn-on circuit comprises a resistive element 511a. The operation of this embodiment may be configured to be similar to the turn on circuit shown in FIG. 14A however the capacitor in this embodiment may not be monolithically integrated but rather included at package or system level as illustrated in FIG. 12B.

FIG. 16 shows a circuit schematic representation of one embodiment of the turn-on circuit 51b. In this embodiment the turn-on circuit comprises a current source 513b, 514b and an enhancement mode transistor 515b. The operation of this embodiment may be configured to be similar to the turn on circuit shown in FIG. 14B however the capacitor in this embodiment may not be monolithically integrated but rather included at package or system level as illustrated in FIG. 13B. In another embodiment not illustrated here a capacitor may be included in parallel to resistor 514b to provide an additional boost during the turn-on transient.

FIG. 17A shows a circuit schematic representation of one embodiment of the on-state circuit 53. In this example the on-state circuit 53 comprises a resistive element 531.

FIG. 17B shows a circuit schematic representation of another embodiment of the on-state circuit 53. In this example the on-state circuit 53 comprises a current source. The current source comprises a low voltage depletion HEMT 532 and a resistive element 533.

The on-state circuit is responsible for providing the gate current required to maintain the potential of the internal gate at a desirable potential when the high voltage transistor (active heterojunction transistor) 50 is in the on-state mode of operation. In this GaN chip the current provided by the on-state circuit is primarily composed of the gate leakage current of the high voltage heterojunction transistor and the current through the voltage clamp circuit. Setting the current appropriately is important as it affects the on-state gate driving losses.

FIG. 18A shows a circuit schematic representation of one embodiment of the turn-off circuit 52. In this example the turn-off circuit 52 comprises a depletion mode transistor 521. The drain terminal of the depletion mode transistor is operatively connected to the external control terminal and the source terminal of the depletion mode transistor is operatively connected to the internal gate terminal of the high voltage transistor 50. The gate terminal of the depletion mode transistor is connected to the low voltage terminal of the high voltage transistor 50. When the signal at the external gate control terminal is low (off-state and turn-off mode) the depletion mode transistor provides a low resistance connection between the internal gate and the external control terminal.

In this embodiment, the depletion mode transistor may also act as an additional current path during the turn-on of the high voltage transistor 50. When the external gate control signal goes high the depletion-mode transistor is in saturation mode and provides an additional conduction path for charging the gate-source capacitance of the high voltage transistor 50. As the voltage of the internal gate terminal rises above the threshold voltage of the second depletion mode transistor that conduction path becomes very resistive.

FIG. 18B shows a circuit schematic representation of an additional embodiment of the turn-off circuit 52. In this embodiment an enhancement mode transistor 522 is also used in the turn-off circuit with the drain of transistor 522 connected to the external control terminal and the source and gate of transistor 522 connected to internal gate of high voltage transistor 50.

Transistor 522 acts as a pull-down network during the turn-off of the overall configuration connecting the internal gate terminal of the high voltage GaN transistor 50 to the external control terminal. When a positive bias (on-state) is applied to the external control terminal, source/gate connected transistor 522 will be reverse-biased and negligible current will flow through it, leaving unaffected the electrical behaviour of the overall high-voltage configuration. When a low (close to zero) bias is applied to the external control terminal during turn-off (and off-state) the source/gate connected transistor 522 will become conductive and the turn-off current flowing through it will discharge the gate capacitance of the high voltage transistor, thus enabling the switching off of the overall configuration.

FIG. 18C shows a circuit schematic representation of an additional embodiment of the turn-off circuit 52. In this embodiment a resistor 523 and a capacitor 524 are included to improve the turn-off circuit response during the turn-off transient.

FIG. 19A shows a circuit schematic representation of one embodiment of the voltage clamp circuit 54. The voltage clamp circuit is intended to limit the internal gate to a pre-designed voltage level such that the voltage on the internal gate terminal does not exceed a given value. The voltage clamp circuit comprises two resistors in series 542, 543 forming a potential divider and an actively switched low voltage enhancement mode transistor 541 controlling the potential on the internal gate terminal of the high voltage transistor. The drain of transistor 541 is connected to the internal gate terminal of high voltage transistor 50 and the source of transistor 541 is connected to the low voltage terminal of high voltage transistor 50. The ratio of the resistors in the potential divider can be used to determine the maximum allowable potential on the internal gate terminal.

FIG. 19B shows an embodiment of FIG. 19A with a capacitor 549 in parallel to resistor 543 in order to improve the response time of the voltage clamp circuit.

FIG. 19C shows an embodiment of FIG. 19A in which the voltage response of the voltage clamp circuit may be adjusted by adding one or more source/gate connected HEMTs 550 in the voltage divider. These HEMTs 550 may be connected in series or parallel with either of the resistors 543 or 542.

FIG. 19D shows a circuit schematic representation of an additional embodiment of the voltage clamp circuit 54.

In this embodiment the voltage clamp circuit further comprises an element to compensate or reduce the effect of temperature. This element is a particular embodiment of the voltage divider which is part of the voltage clamp circuit. The first part of the voltage divider may comprise an integrated resistor 543 and the second part of the voltage divider may comprise a current source 544, 545 consisting of a depletion mode HEMT 544 with the source connected to the first terminal of an additional resistor 545 and the gate connected to the second terminal of the resistor. The second part of the voltage divider may further comprise a resistor 542 in parallel to the current source 544, 545.

The first part of the voltage divider may further comprise a similar current source in parallel to the resistor 543 in other examples not illustrated here.

Both parts of the voltage divider will increase the voltage drop at a given current with increasing temperature. But the current sources and resistors change the voltage drop at a dissimilar rate. By designing the sizes of the normally-on HEMTs and the resistances, the output of the voltage divider can be set by the design in such a way that the voltage drop across the pull-down circuit and/or the voltage drop across the auxiliary HEMT has a much smaller temperature dependence.

FIG. 20 shows a circuit schematic representation of an additional embodiment of the voltage clamp circuit 54. In this embodiment the voltage clamp circuit comprises several source/gate connected transistors 546, 547, 548 in series where the source/gate connected terminal is connected to the internal gate terminal of the high voltage transistor 50 and the drain terminal is connected to the low voltage terminal of the high voltage transistor 50.

It will be appreciated that the auxiliary transistor described above in relation to all the embodiments can be a low voltage transistor or a high voltage transistor.

It will also be appreciated that terms such as "top" and "bottom", "above" and "below", "lateral" and "vertical", and "under" and "over", "front" and "behind", "underlying", etc. may be used in this specification by convention and that no particular physical orientation of the device as a whole is implied.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the disclosure, whether alone or in any appropriate combination with any other feature disclosed or illustrated herein.

REFERENCES

[1] U. K. Mishra et al., GaN—Based RF power devices and amplifiers, Proc. IEEE, vol 96, no 2, pp 287-305, 2008.
[2] M. H. Kwan et al, CMOS-Compatible GaN-on-Si Field-Effect Transistors for High Voltage Power Applications, IEDM, San Fran., December 2014, pp 17.6.1-17.6.4
[3] S. Lenci et al., Au—free AlGan/GaN power diode 8-in Si substrate with gated edge termination, Elec. Dev. Lett., vol 34, no 8, pp 1035, 2013.
[4] T. Oka and T. Nozawa, IEEE Electron Device Lett., 29, 668 (2008).
[5] Y. Cai, Y. Zhou, K. J. Chen, and K. M. Lau, IEEE Electron Device Lett., 26, 435 (2005)
[6] W. Saito, Y. Takada, M. Kuraguchi, K. Tsuda, and I. Omura, IEEE Trans. Electron Devices, 53, 356, (2006).
[7] Y. Uemoto, M. Hikita, H. Ueno, H. Matsuo, H. Ishida, M. Yanagihara, T. Ueda, T. Tanaka, and D. Ueda, IEEE Trans. Electron Devices, 54, 3393 (2007).
[8] I. Hwang, H. Choi, J. Lee, H. S. Choi, J. Kim, J. Ha, C. Y. Um, S. K. Hwang, J. Oh, J. Y. Kim, J. K. Shin, Y. Park, U. I. Chung, I. K. Yoo, and K. Kim, Proc. ISPSD, Bruges, Belgium, p. 41 (2012).
[9] M. J. Uren, J. Moreke, and M. Kuball, IEEE Trans. Electron Devices, 59, 3327 (2012).
[10] L. Efthymiou et al, On the physical operation and optimization of the p-GaN gate in normally-off GaN HEMT devices, Appl. Phys. Lett., 110, 123502 (2017)
[11] GS66504B, GaN Systems, Ottawa, Canada.
[12] Infineon 650V CoolMOS C7 Power Transistor IPL65R130C7.
[13] L. Efthymiou et al, On the Source of Oscillatory Behaviour during Switching of Power Enhancement Mode GaN HEMTs, Energies, vol. 10, no. 3, 2017
[14] F. Lee, L. Y. Su, C. H. Wang, Y. R. Wu, and J. Huang, "Impact of gate metal on the performance of p-GaN/AlGaN/GaN High electron mobility transistors," IEEE Electron Device Lett., vol. 36, no. 3, pp. 232-234, 2015.
[15] O. Ambacher, J. Smart, J. R. Shealy, N. G. Weimann, K. Chu, M. Murphy, W. J. Schaff, L. F. Eastman, R. Dimitrov, L. Wittmer, M. Stutzmann, W. Rieger, and J.

Hilsenbeck, "Two-dimensional electron gases induced by spontaneous and piezoelectric polarization charges in N- and Ga-face AlGaN/GaN heterostructures," J. Appl. Phys., vol. 85, no. 6, p. 3222, 1999.

[16] Okita, H., Hikita, M., Nishio, A., Sato, T., Matsunaga, K., Matsuo, H., Mannoh, M. and Uemoto, Y., 2016, June. Through recessed and regrowth gate technology for realizing process stability of GaN-GITs. In Power Semiconductor Devices and ICs (ISPSD), 2016 28th International Symposium on (pp. 23-26). IEEE.

[17] Lu, B., Saadat, O. I. and Palacios, T., 2010. High-performance integrated dual-gate AlGaN/GaN enhancement-mode transistor. IEEE Electron Device Letters, 31(9), pp. 990-992.

[18] Yu, G., Wang, Y., Cai, Y., Dong, Z., Zeng, C. and Zhang, B., 2013. Dynamic characterizations of AlGaN/GaN HEMTs with field plates using a double-gate structure. IEEE Electron Device Letters, 34(2), pp. 217-219

[19] Feng, P., Teo, K. H., Oishi, T., Yamanaka, K. and Ma, R., 2013, May. Design of enhancement mode single-gate and doublegate multi-channel GaN HEMT with vertical polarity inversion heterostructure. In Power Semiconductor Devices and ICs (ISPSD), 2013 25th International Symposium on (pp. 203-206). IEEE

[20] Xiaobin, X. I. N., Pophristic, M. and Shur, M., Power Integrations, Inc., 2013. Enhancement-mode HFET circuit arrangement having high power and high threshold voltage. U.S. Pat. No. 8,368,121.

[21] GaN Systems, GN001 Application Guide Design with GaN Enhancement mode HEMT.

The invention claimed is:

1. A III-nitride power semiconductor based heterojunction device comprising a low voltage terminal, a high voltage terminal and a control terminal and further comprising:
an active heterojunction transistor formed on a substrate, the active heterojunction transistor comprising:
a first III-nitride semiconductor region comprising a first heterojunction comprising an active two dimensional carrier gas;
a first terminal operatively connected to the III-nitride semiconductor region and further connected to the low voltage terminal;
a second terminal laterally spaced from the first terminal and operatively connected to the III-nitride semiconductor region and further connected to the high voltage terminal;
an internal gate terminal operatively connected to an active gate region formed over the III-nitride semiconductor region, the active gate region being formed between the first terminal and the second terminal;
a voltage clamp circuit configured to limit a maximum potential that can be applied to the internal gate terminal, wherein the voltage clamp circuit comprises a first connection to the internal gate terminal of the active heterojunction transistor and a second connection to the low voltage terminal;
a turn-on circuit configured to control the internal gate terminal of the active heterojunction transistor during a turn-on operation, and wherein the turn-on circuit is configured to control a transient gate current in the internal gate terminal and a transient current in the voltage clamp circuit during the turn-on operation, wherein the turn-on circuit comprises a third connection to the internal gate terminal of the active heterojunction transistor;
an on-state circuit configured to control the internal gate terminal of the active heterojunction transistor during an on-state operation, and wherein the on-state circuit is configured to control a steady-state gate current in the internal gate terminal and a steady-state current in the voltage clamp circuit during the on-state operation, wherein the on-state circuit comprises a fourth connection to the internal gate terminal of the active heterojunction transistor and a fifth connection to the control terminal;
a turn-off circuit configured to control the internal gate terminal of the active heterojunction transistor during a turn-off operation and during an off-state, and wherein the turn-off circuit is configured to control a transient gate current from the internal gate terminal to the control terminal, and wherein the turn-off circuit is operatively connected to the internal gate terminal and the control terminal during the turn-off operation and the off-state, wherein the turn-off circuit comprises a sixth connection to the internal gate terminal of the active heterojunction transistor and a seventh connection to the control terminal; and
wherein the active heterojunction transistor, the voltage clamp circuit, the turn-on circuit, the on-state circuit and the turn-off circuit are monolithically integrated.

2. The heterojunction power device according to claim 1, wherein the turn-on circuit further comprises an eighth connection to the control terminal.

3. The heterojunction power device according to claim 2, further comprising an additional external terminal configured to act as the input of the turn-on circuit.

4. The heterojunction power device according to claim 1, further comprising an additional external terminal configured to act as an input of the turn-on circuit.

5. The heterojunction power device according to claim 1, wherein the turn-on circuit further comprises a resistor.

6. The heterojunction power device according to claim 1, wherein the turn-on circuit further comprises a current source and an enhancement mode transistor.

7. The heterojunction power device according to claim 6, wherein the current source comprises a low voltage transistor, a gate terminal and a resistor, wherein a first terminal of the current source comprises a first terminal of the low voltage transistor, a second terminal of the current source is operatively connected to a gate terminal of the low voltage transistor, and the resistor is connected in series between the second terminal of the current source and a second terminal of the low voltage transistor.

8. The heterojunction power device according to claim 6, wherein the turn-on circuit further comprises a capacitor.

9. The heterojunction power device according to claim 1, wherein the on-state circuit further comprises a resistor.

10. The heterojunction power device according to claim 1, wherein the on-state circuit further comprises a current source.

11. The heterojunction power device according to claim 10, wherein the current source comprises a low voltage transistor, a gate terminal and a resistor, wherein a first terminal of the current source comprises a first terminal of the low voltage transistor, a second terminal of the current source is operatively connected to a gate terminal of the low voltage transistor, and the resistor is connected in series between the second terminal of the current source and a second terminal of the low voltage transistor.

12. The heterojunction power device according to claim 1, wherein the turn-off circuit further comprises a depletion mode low voltage transistor.

13. The heterojunction power device according to claim 12, wherein the turn-off circuit further comprises an enhancement mode low voltage transistor connected in parallel to the depletion mode low voltage transistor, wherein a gate terminal of the enhancement mode low voltage transistor is operatively connected to either the low voltage terminal or the high voltage terminal.

14. The heterojunction power device according to claim 1, wherein the turn-off circuit further comprises an enhancement mode low voltage transistor, wherein a gate terminal of the enhancement mode low voltage transistor is operatively connected to either a source terminal or a drain terminal of the enhancement mode low voltage transistor.

15. The heterojunction power device according to claim 1, wherein the turn-off circuit further comprises a depletion mode low voltage transistor, a capacitor, a resistor and an enhancement mode low voltage transistor.

16. The heterojunction power device according to claim 1, wherein the voltage clamp circuit further comprises:
   an enhancement mode low voltage transistor, wherein a drain terminal of the enhancement mode low voltage transistor is operatively connected to the internal gate terminal of the active heterojunction transistor, a source terminal of the enhancement mode low voltage transistor is operatively connected to the low-voltage terminal; and
   a potential divider, wherein a mid-point of the potential divider is operatively connected to a gate terminal of the enhancement mode low voltage transistor.

17. The heterojunction power device according to claim 16, wherein the potential divider comprises any one or more of:
   at least one resistive element;
   at least one capacitor; and
   at least one low voltage source-gate connected heterojunction transistor.

18. The heterojunction power device according to claim 16, wherein the voltage clamp circuit further comprises:
   a low voltage depletion mode transistor, wherein a drain terminal of the low voltage depletion mode transistor is operatively connected to the mid-point of the potential divider, a gate terminal of the low voltage depletion mode transistor is operatively connected to the low voltage terminal; and
   a resistor connected between a source terminal of the low voltage depletion mode transistor and the low voltage terminal.

19. The heterojunction power device according to claim 1, wherein the voltage clamp circuit further comprises two or more low voltage enhancement mode transistors connected in series, wherein a gate terminal of each of said low voltage enhancement mode transistors is operatively connected to a respective drain terminal of the low voltage depletion mode transistors.

20. The heterojunction power device of claim 1, further comprising one or more monolithically integrated temperature compensated circuits, wherein the one or more monolithically integrated temperature compensated circuit comprise:
   a low voltage heterojunction transistor;
   a first resistor connected in series with the low-voltage heterojunction transistor;
   a second resistor connected in parallel with the low-voltage heterojunction transistor; and
   wherein the one or more monolithically integrated temperature compensated circuit are configured to reduce an effect of variations in temperature on a circuit behaviour of connected components.

* * * * *